(12) United States Patent
Koyanagi et al.

(10) Patent No.: US 10,622,572 B2
(45) Date of Patent: Apr. 14, 2020

(54) ORGANIC THIN-FILM TRANSISTOR AND METHOD FOR MANUFACTURING THE SAME, MATERIAL FOR ORGANIC THIN-FILM TRANSISTOR, COMPOSITION FOR ORGANIC THIN-FILM TRANSISTOR, COMPOUND, AND ORGANIC SEMICONDUCTOR FILM

(71) Applicants: FUJIFILM Corporation, Tokyo (JP); THE UNIVERSITY OF TOKYO, Tokyo (JP)

(72) Inventors: Masashi Koyanagi, Kanagawa (JP); Hiroaki Tsuyama, Kanagawa (JP); Eiji Fukuzaki, Kanagawa (JP); Yoshihisa Usami, Kanagawa (JP); Tetsuya Watanabe, Kanagawa (JP); Takashi Goto, Kanagawa (JP); Toshihiro Okamoto, Tokyo (JP); Junichi Takeya, Tokyo (JP)

(73) Assignees: FUJIFILM Corporation, Tokyo (JP); THE UNIVERSITY OF TOKYO, Tokyo (JP)

( * ) Notice: Subject to any disclaimer, the term of this patent is extended or adjusted under 35 U.S.C. 154(b) by 142 days.

(21) Appl. No.: 15/885,859

(22) Filed: Feb. 1, 2018

(65) Prior Publication Data
US 2018/0159053 A1    Jun. 7, 2018

Related U.S. Application Data

(63) Continuation of application No. PCT/JP2016/072659, filed on Aug. 2, 2016.

(30) Foreign Application Priority Data

Aug. 4, 2015  (JP) .................................. 2015-154608
Aug. 18, 2015  (JP) .................................. 2015-161299
Aug. 1, 2016  (JP) .................................. 2016-151069

(51) Int. Cl.
*H01L 51/00*  (2006.01)
*H01B 1/00*   (2006.01)
(Continued)

(52) U.S. Cl.
CPC ........ *H01L 51/0094* (2013.01); *C07F 7/0812* (2013.01); *C07F 7/1804* (2013.01);
(Continued)

(58) Field of Classification Search
CPC ..... H01B 1/12; H01L 29/786; H01L 51/0002; C07D 495/22
See application file for complete search history.

(56) References Cited

U.S. PATENT DOCUMENTS 8,785,915 B2 *  7/2014  Nakano ................... C07C 15/20
                                                  257/40
8,963,128 B2 *  2/2015  Nakano ................... C07C 15/38
                                                  257/40
(Continued)

FOREIGN PATENT DOCUMENTS

JP    2010-118415 A     5/2010
JP    2010-225856 A    10/2010
(Continued)

OTHER PUBLICATIONS

An Office Action mailed by the Japanese Patent Office dated Feb. 5, 2019, which corresponds to Japanese Patent Application No. 2017-533088 and is related to U.S. Appl. No. 15/885,859.
(Continued)

*Primary Examiner* — Mark Kopec
(74) *Attorney, Agent, or Firm* — Studebaker & Brackett PC

(57) ABSTRACT

An object of the present invention is to provide an organic thin-film transistor which has an organic semiconductor film produced using a compound having an excellent solubility in organic solvents and has an excellent carrier mobility, a compound, a material for an organic thin-film transistor for which the compound is used, a composition for an organic thin-film transistor, a method for manufacturing an organic thin-film transistor, and an organic semiconductor film.

(Continued)

An organic thin-film transistor of the present invention contains a compound which is represented by General Formula (1) or General Formula (2) in an organic semiconductor film (organic semiconductor layer) thereof and has a molecular weight of 3,000 or less.

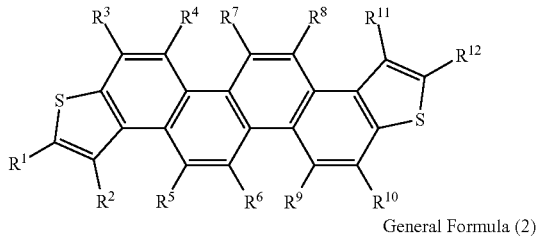

In General Formula (1) and General Formula (2), at least one of $R^5$, . . . , or $R^8$ is a group other than a hydrogen atom.

20 Claims, 3 Drawing Sheets

(51) Int. Cl.
C07F 7/18 (2006.01)
H01B 1/12 (2006.01)
C07F 7/08 (2006.01)
H01L 51/05 (2006.01)

(52) U.S. Cl.
CPC .......... H01B 1/12 (2013.01); H01L 51/0074 (2013.01); H01L 51/0003 (2013.01); H01L 51/0004 (2013.01); H01L 51/0005 (2013.01); H01L 51/0007 (2013.01); H01L 51/0012 (2013.01); H01L 51/0545 (2013.01); H01L 51/0558 (2013.01)

(56) References Cited

U.S. PATENT DOCUMENTS

| 10,283,719 B2* | 5/2019 | Koyanagi | C09B 57/00 |
| 2011/0210319 A1 | 9/2011 | Nakano et al. | |
| 2013/0146818 A1 | 6/2013 | Wang et al. | |
| 2013/0161568 A1 | 6/2013 | Wang et al. | |
| 2013/0248771 A1 | 9/2013 | Mitchell et al. | |

FOREIGN PATENT DOCUMENTS

| JP | 2013-540697 A | 11/2013 |
| JP | 2013-544755 A | 12/2013 |
| JP | 2014-504284 A | 2/2014 |
| JP | 2014-078729 A | 5/2014 |
| JP | 2014-122189 A | 7/2014 |
| JP | 2014-139143 A | 7/2014 |
| JP | 2015-032715 A | 2/2015 |
| JP | 2015-032716 A | 2/2015 |
| WO | 2010/024388 A1 | 3/2010 |

OTHER PUBLICATIONS

Sarkar et al., Synthesis of Carboxy-Functionalized Polycyclic Arenes by Oxidative Cyclizations of 2,3-Diarylacrylates, Asian Journal of Organic Chemistry, vol. 1, Oct. 19, 2012, pp. 366-376.
International Search Report issued in PCT/JP2016/072659; dated Oct. 4, 2016.
Written Opinion issued in PCT/JP2016/072659; dated Oct. 4, 2016.

* cited by examiner

ORGANIC THIN-FILM TRANSISTOR AND METHOD FOR MANUFACTURING THE SAME, MATERIAL FOR ORGANIC THIN-FILM TRANSISTOR, COMPOSITION FOR ORGANIC THIN-FILM TRANSISTOR, COMPOUND, AND ORGANIC SEMICONDUCTOR FILM

CROSS-REFERENCE TO RELATED APPLICATIONS

This application is a Continuation of PCT International Application No. PCT/JP2016/072659 filed on Aug. 2, 2016, which claims priority under 35 U.S.C. § 119(a) to Japanese Patent Application No. 2015-154608 filed on Aug. 4, 2015, Japanese Patent Application No. 2015-161299 filed on Aug. 18, 2015 and Japanese Patent Application No. 2016-151069 filed on Aug. 1, 2016. Each of the above applications is hereby expressly incorporated by reference, in its entirety, into the present application.

BACKGROUND OF THE INVENTION

1. Field of the Invention

The present invention relates to an organic thin-film transistor and a method for manufacturing the same, a material for an organic thin-film transistor, a composition for an organic thin-film transistor, a compound, and an organic semiconductor film.

2. Description of the Related Art

Organic thin-film transistors (organic TFT) having organic semiconductor films (organic semiconductor layers) are used in field-effect transistors (FET) that are used in liquid crystal displays or organic electroluminescence (EL) displays, apparatuses in which logic circuits are used such as radio frequency identifier (RFID: RF tag) or memories, or the like since weight reduction, cost reduction, and softening are possible.

It is known that, as compounds for forming the above-described organic semiconductor films, polycondensed compounds including heteroaromatic rings are useful.

For example, JP2014-078729A and WO2010/024388A disclose a compound in which a π conjugation of the compound is enlarged by further condensing a heteroaromatic ring (as a heteroaromatic ring group, furan, thiophene, or N-substituted pyrrole) into a chrysene skeleton.

SUMMARY OF THE INVENTION

Meanwhile, in recent years, from the viewpoint of improving the performance of organic thin-film transistors, there has been a current demand for the additional improvement of the carrier mobility of organic thin-film transistors.

In response to such a demand, the present inventors repeated studies regarding a polycondensed compound obtained by further condensing thiophene as a heteroaromatic ring into a chrysene skeleton (for example, corresponding to a comparative compound 3 described below) disclosed in JP2014-078729A and found that, in a case in which this compound was used for organic semiconductor films in organic thin-film transistors, the carrier mobility did not always satisfy the currently-demanded level.

The present inventors studied reasons therefor and consequently found that the low solubility of this compound in organic solvents has a relationship with the low carrier mobility.

Therefore, an object of the present invention is to provide an organic thin-film transistor which has an organic semiconductor film produced using a compound having an excellent solubility in organic solvents and has an excellent carrier mobility.

In addition, another object of the present invention is to provide a compound which has an excellent solubility in solvents and, when used for organic semiconductor films in organic thin-film transistors, makes the organic thin-film transistors exhibit a high carrier mobility, a material for an organic thin-film transistor for which the compound is used, a composition for an organic thin-film transistor, a method for manufacturing an organic thin-film transistor, and an organic semiconductor film.

As a result of intensive studies regarding the above-described object, the present inventors found that the use of a compound represented by General Formula (1) or a compound represented by General Formula (2) which is a structural isomer of the above-described compound enables the obtainment of desired effects and completed the present invention.

That is, the present inventors found that the object can be achieved by the following constitutions.

[1] An organic thin-film transistor comprising: an organic semiconductor film including a compound that is represented by General Formula (1) or General Formula (2) and has a molecular weight of 3,000 or less.

[2] The organic thin-film transistor according to [1], in which, in General Formula (1) and General Formula (2), the number of carbon atoms included in each of $R^1$ to $R^{12}$ is independently 30 or less.

[3] The organic thin-film transistor according to [1] or [2], in which, in General Formula (1) and General Formula (2), at least one of $R^1$, . . . , or $R^{12}$ has, as $R^W$, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms.

[4] The organic thin-film transistor according to any one of [1] to [3], in which, in General Formula (1) and General Formula (2), $R^1$ and $R^{12}$ are the same group, $R^2$ and $R^{11}$ are the same group, $R^3$ and $R^{10}$ are the same group, $R^4$ and $R^9$ are the same group, $R^5$ and $R^8$ are the same group, and $R^6$ and $R^7$ are the same group.

[5] The organic thin-film transistor according to any one of [1] to [4], in which the compound is represented by General Formula (3) or General Formula (4) and has a molecular weight of 3,000 or less.

[6] The organic thin-film transistor according to any one of [1] to [5], in which the compound is represented by General Formula (5) or General Formula (6) and has a molecular weight of 3,000 or less.

[7] A compound which is represented by General Formula (1) or General Formula (2) and has a molecular weight of 3,000 or less.

[8] The compound according to [7], in which, in General Formula (1) and General Formula (2), the number of carbon atoms included in each of $R^1$ to $R^{12}$ is independently 30 or less.

[9] The compound according to [7] or [8], in which, in General Formula (1) and General Formula (2), at least one of $R^1, \ldots,$ or $R^{12}$ has, as $R^W$, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms.

[10] The compound according to any one of [7] to [9], in which, in General Formula (1) and General Formula (2), $R^1$ and $R^{12}$ are the same group, $R^2$ and $R^{11}$ are the same group, $R^3$ and $R^{10}$ are the same group, $R^4$ and $R^9$ are the same group, $R^5$ and $R^8$ are the same group, and $R^6$ and $R^7$ are the same group.

[11] The compound according to any one of [7] to [10], in which the compound is represented by General Formula (3) or General Formula (4) and has a molecular weight of 3,000 or less.

[12] The compound according to any one of [7] to [11], in which the compound is represented by General Formula (5) or General Formula (6) and has a molecular weight of 3,000 or less.

[13] A material for an organic thin-film transistor comprising: the compound according to any one of [7] to [12].

[14] A composition for an organic thin-film transistor comprising: the compound according to any one of [7] to [12].

[15] A method for manufacturing an organic thin-film transistor comprising: a step of forming an organic semiconductor film by applying the composition for an organic thin-film transistor according to [14] on a substrate and drying the composition.

[16] An organic semiconductor film comprising: the compound according to any one of [7] to [12].

In the present specification, the expression of a compound is used to refer to the compound, and, additionally, a salt thereof and an ion thereof.

In the present specification, in a case in which a plurality of substituents, linking groups, or the like (hereinafter, referred to as substituents or the like) is indicated by a specific reference sign or a plurality of substituents or the like is specified at the same time, the respective substituents or the like may be identical to or different from one another. This is also true in the case of specifying the number of substituents or the like.

In addition, unless particularly otherwise described, in a case in which a plurality of substituents or the like comes close to one another (particularly, is adjacent to one another), the substituents or the like may be linked or condensed to one another and thus form a ring.

Furthermore, in the present specification, substituents or the like that are not clarified as being substituted or non-substituted may further have a substituent therein unless intended effects are not impaired. This is also true for compounds that are not clarified as being substituted or nonsubstituted.

In the present specification, numerical ranges expressed using "to" include numerical values before and after "to" as the lower limit value and the upper limit value.

According to the present invention, it is possible to provide an organic thin-film transistor which has an organic semiconductor film produced using a compound having an excellent solubility in organic solvents and has an excellent carrier mobility.

In addition, according to the present invention, it is possible to provide a compound which has an excellent solubility in solvents and, when used for organic semiconductor films in organic thin-film transistors, makes the organic thin-film transistors exhibit a high carrier mobility, a material for an organic thin-film transistor for which the compound is used, a composition for an organic thin-film transistor, a method for manufacturing the same, and an organic semiconductor film.

DESCRIPTION OF THE PREFERRED EMBODIMENTS

[Organic Thin-Film Transistor]

Figure 1:
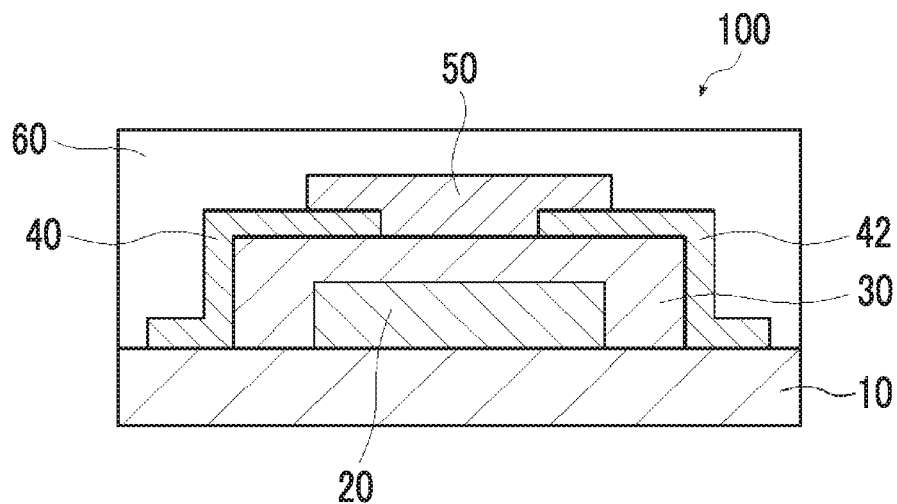
FIG. 1 is a schematic cross-sectional view of a bottom contact-type organic thin-film transistor according to an embodiment of the present invention.

An organic thin-film transistor of the present invention includes a compound that is represented by General Formula (1) and has a molecular weight of 3,000 or less or a compound that is a structural isomer thereof, is represented by General Formula (2), and has a molecular weight of 3,000 or less in an organic semiconductor film (organic semiconductor layer) thereof.

The compound represented by General Formula (1) or (2) has a characteristic that, in organic semiconductor films formed of fine crystal thin films, the phases of the electron orbitals of molecules in fine crystals favorably match, the interaction among the respective molecules is strong, and the molecules are excellently packed, and thus the highest occupied molecular orbitals (HOMO) of the molecules are likely to overlap one another.

Furthermore, the compound represented by General Formula (1) or General Formula (2) is a highly symmetric structure in which a π conjugation is enlarged by further condensing thiophene into a chrysene skeleton, and thus, generally, the solubility is assumed to be poor, but the compound has a substituent having a specific structure in the vicinity of the symmetric center of a π-conjugated plane, which weakens the CH-π interaction between molecules in a herringbone structure through an effect of a steric hindrance, and thus an excellent solubility is developed.

In a case in which the compound represented by General Formula (1) or (2) is used for organic semiconductor films in organic thin-film transistors, the above-described constitution improves, that is, it is possible to form uniform thin films having a high carrier mobility.

Particularly, according to compounds obtained by introducing substituents having a specific structure into $R^5$ and $R^8$ in General Formula (1) or General Formula (2), the π-conjugated main plane exhibits excellent intermolecular interaction while not allowing the planarity to be collapsed by the substituents, and thus it is possible to obtain an excellent carrier mobility regardless of film-forming means and transistor layer constitutions.

<Compound Represented by General Formula (1) or General Formula (2)>

The organic semiconductor film (organic semiconductor layer) in the organic thin-film transistor of the present invention includes the compound represented by General Formula (1) or General Formula (2) (General Formula (1) and General Formula (2) have a relationship of a structural isomer with each other).

The compounds represented by General Formulae (1) and (2) are new compounds and can not only be preferably used for organic semiconductor films in organic thin-film transistors but also be used for other uses described below.

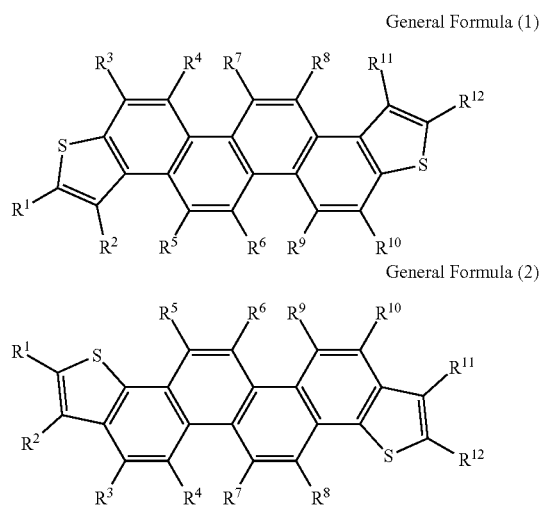

In General Formula (1) and General Formula (2), $R^1$ to $R^{12}$ each independently represent a group represented by Formula (W).

In Formula (W), $L^W$ is a divalent linking group of any of a single bond, —O—, —S—, —NR$^{13}$—, —CO—, —SO—, —SO$_2$—, or —Si(R$^{14}$)(R$^{15}$) or a divalent linking group obtained by bonding two or more divalent linking groups described above, $R^W$ represents a hydrogen atom, a halogen atom, or an alkyl group, an alkenyl group, an alkynyl group, an aryl group, or a heteroaryl group, all of which may have a substituent, and $R^{13}$ to $R^{15}$ each independently represent a hydrogen atom or an alkyl group, an alkenyl group, an alkynyl group, an aryl group, or a heteroaryl group, all of which may have a substituent.

Here, in General Formula (1) and General Formula (2), at least one of $R^5$, . . . , or $R^8$ is a group other than a hydrogen atom.

Meanwhile, in the present specification, unless particularly otherwise described, "alkyl groups" and "alkenyl groups" refer to all of linear, branched, and cyclic alkyl groups and all of linear, branched, and cyclic alkenyl groups. Meanwhile, examples of cyclic alkyl groups include a cycloalkyl group, a bicycloalkyl group, a tricycloalkyl group, and the like. In addition, examples of cyclic alkenyl groups include a cycloalkenyl group, a bicycloalkenyl group, and the like.

In addition, in the present specification, example of hetero atoms included in "heteroaryl groups" include a sulfur atom (S), an oxygen atom (O), a nitrogen atom (N), and the like.

The molecular weights of the compounds represented by General Formula (1) and General Formula (2) are 3,000 or less, preferably 250 to 2,000, more preferably 300 to 1,000, and still more preferably 350 to 800. The molecular weight is preferably set in the above-described range since it is possible to further increase the solubility in solvents.

In General Formula (1) and General Formula (2), $R^1$ to $R^{12}$ each independently represent a group represented by Formula (W).

$L^W$ is a divalent linking group of any of a single bond, —O—, —S—, —NR$^{13}$—, —CO—, —SO—, —SO$_2$—, or —Si(R$^{14}$)(R$^{15}$) or a divalent linking group obtained by bonding two or more divalent linking groups described above, preferably a single bond, —O—, —S—, —NR$^{13}$—, —CO—, —O—CO—, —CO—O—, —NR$^{13}$—CO—, —CO—NR$^{13}$—, —O—CO—O—, —NR$^{13}$—CO—O—, —OCO—NR$^{13}$— or —NR$^{13}$—CO—NR$^{13}$—, more preferably a single bond, —O—, —S—, —NR$^{13}$—, —CO—, —O—CO—, or —CO—O—, and most preferably a single bond.

$R^{13}$ to $R^{15}$ represent a hydrogen atom or an alkyl group (preferably having 1 to 20 carbon atoms), an alkenyl group (preferably having 2 to 6 carbon atoms), an alkynyl group (preferably having 2 to 6 carbon atoms), an aryl group (preferably having 6 to 14 carbon atoms), or a heteroaryl group (preferably having 3 to 12 carbon atoms), all of which may have a substituent and is preferably a hydrogen atom, an alkyl group, or an aryl group, more preferably a hydrogen atom or an alkyl group, and still more preferably an alkyl group having 1 to 8 carbon atoms.

$R^W$ represents a hydrogen atom, a halogen atom, or an alkyl group, an alkenyl group, an alkynyl group, an aryl group, or a heteroaryl group, all of which may have a substituent.

The alkyl group is preferably an alkyl group having 1 to 20 carbon atoms, more preferably an alkyl group having 2 to 15 carbon atoms, and still more preferably an alkyl group having 3 to 10 carbon atoms.

The alkenyl group is preferably an alkenyl group having 2 to 6 carbon atoms, more preferably an alkenyl group having 2 to 4 carbon atoms, and still more preferably an alkenyl group having 2 carbon atoms.

The alkynyl group is preferably an alkynyl group having 2 to 6 carbon atoms, more preferably an alkynyl group having 2 to 4 carbon atoms, and still more preferably an alkynyl group having 2 carbon atoms.

The aryl group is preferably an aryl group having 6 to 20 carbon atoms, more preferably an aryl group having 6 to 14 carbon atoms, and still more preferably an aryl group having 6 to 10 carbon atoms.

The heteroaryl group is preferably a heteroaryl group having 3 to 20 carbon atoms, more preferably an heteroaryl group having 3 to 12 carbon atoms, and still more preferably an heteroaryl group having 3 to 8 carbon atoms.

In General Formula (1) and General Formula (2), among $R^5$ to $R^8$, from the viewpoint of the solubility, the crystal structure, and the intermolecular interaction, at least one group has a group other than a hydrogen atom (hereinafter, referred to as "substituent W"), and, among these, two groups preferably have a group other than a hydrogen atom.

In addition, in $R^1$ to $R^{12}$, the number of the substituents W is preferably 2 to 4.

In General Formula (1) and General Formula (2), in a case in which the substituents W are introduced into IV to $R^{12}$, the substituents W are preferably disposed at locations so that the entire molecule forms a point symmetric structure, and the substituents of the same kind are preferably disposed at locations in which the entire molecule forms a point symmetric structure so that the entire molecule, including the structure of the substituents, forms a point symmetric structure. Specifically, a case in which the substituents W (preferably substituents of the same kind) are present at the locations of both $R^1$ and $R^{12}$, a case in which the substituents W (preferably substituents of the same kind) are present at the locations of both $R^2$ and $R^{11}$, a case in which the substituents W (preferably substituents of the same kind) are present at the locations of both $R^3$ and $R^{10}$, a case in which the substituents W (preferably substituents of the same kind) are present at the locations of both $R^4$ and $R^9$, a case in which the substituents W (preferably substituents of the same kind) are present at the locations of both $R^5$ and $R^8$, a case in which the substituents W (preferably substituents of the same kind) are present at the locations of both $R^6$ and $R^7$, and combinations of two or more cases described above are preferred. Among these, from the viewpoint of the solubility, the crystal structure, and the intermolecular interaction, the case in which the substituents W are present at the locations of both $R^5$ and $R^8$ and the case in which the substituents W are present at the locations of both $R^6$ and $R^7$ are more preferred and the case in which the substituents W are present at the locations of both $R^5$ and $R^8$ is most preferred.

In a case in which General Formula (1) and General Formula (2) have the substituent W, from the viewpoint of the solubility, the crystal structure, and the intermolecular interaction, the numbers of carbon atoms in the substituent W in $R^1$ to $R^{12}$ (the total number of carbon atoms included in both $L^W$ and $R^W$ in Formula (W)) each independently preferably 30 or less, more preferably 25 or less, still more preferably 20 or less, and particularly preferably 16 or less.

In General Formula (1) and General Formula (2), from the viewpoint of the solubility and the intermolecular interaction, at least one of $R^1$, . . . , or $R^{12}$ preferably has, as $R^W$, any group selected from the group consisting of a substituted or unsubstituted alkyl group having 20 or less carbon atoms (preferably 1 to 20 carbon atoms), a substituted or unsubstituted alkenyl group having 20 or less carbon atoms (preferably 2 to 6 carbon atoms), a substituted or unsubstituted alkynyl group having 20 or less carbon atoms (preferably 2 to 6 carbon atoms), a substituted or unsubstituted aryl group having 20 or less carbon atoms (preferably 6 to 20 carbon atoms), and a substituted or unsubstituted heteroaryl group having 20 or less carbon atoms (preferably 3 to 20 carbon atoms), in at least one of the combinations of $R^5$ and $R^8$ or $R^6$ and $R^7$, the groups each more preferably have the above-described groups independently, and both $R^5$ and $R^8$ each still more preferably have the above-described groups independently.

As described above, $R^1$ to $R^{12}$ have, as $R^W$, a hydrogen atom, a halogen atom, or any group selected from the group consisting of a substituted or unsubstituted alkyl group (preferably having 3 to 10 carbon atoms), a substituted or unsubstituted alkenyl group (preferably having 2 to 6 carbon atoms), a substituted or unsubstituted alkynyl group (preferably having 2 to 6 carbon atoms), a substituted or unsubstituted aryl group (preferably having 6 to 10 carbon atoms), and a substituted or unsubstituted heteroaryl group (preferably having 3 to 8 carbon atoms). Among these, from the viewpoint of the solubility and the crystallinity, the groups more preferably have, as $R^W$, a hydrogen atom, a halogen atom, or any group selected from the group consisting of a substituted or unsubstituted alkyl group (preferably having 3 to 10 carbon atoms) and a substituted or unsubstituted alkynyl group (preferably having 2 to 6 carbon atoms).

In General Formula (1) and General Formula (2), examples of the substituent that the alkyl group, the alkenyl group, the alkynyl group, the aryl group, and the heteroaryl group as $R^1$ to $R^{15}$ include a halogen atom, an alkyl group (including a cycloalkyl group, a bicycloalkyl group, and a tricycloalkyl group), an aryl group, a heterocyclic group (also referred to as "heterocyclic group"), a cyano group, a hydroxy group, a nitro group, a carboxy group, an alkoxy group, an aryloxy group, a silyl group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), a sulfate group (—OSO$_3$H), and other well-known substituents. In addition, the substituent may be substituted with another substituent.

Among these, the substituent is preferably a halogen atom, an alkyl group, an alkoxy group, an alkylthio group, an aryl group, or a silyl group, more preferably a fluorine atom, a substituted or unsubstituted alkyl group having 1 to 10 carbon atoms, a substituted or unsubstituted alkoxy group having 1 to 10 carbon atoms, a substituted or unsubstituted methylthio group, a phenyl group, or a silyl group, particularly preferably a fluorine atom, a substituted or unsubstituted alkyl group having 1 to 10 carbon atoms, a substituted or unsubstituted alkoxy group having 1 to 10 carbon atoms, a substituted or unsubstituted methylthio group, or a substituted or unsubstituted alkylsilyl group (the number of carbon atoms in the alkyl group is preferably 1 to 10, more preferably 1 to 5, and still more preferably 1 to 3), and most preferably a substituted or unsubstituted alkyl group having 1 to 10 carbon atoms or a substituted or unsubstituted alkylsilyl group (the number of carbon atoms in the alkyl group is preferably 1 to 10, more preferably 1 to 5, and still more preferably 1 to 3).

In General Formula (1) and General Formula (2), in a case in which $R^W$ is not an alkyl group, from the viewpoint of solubility, $R^W$ preferably has a substituted or unsubstituted alkyl group having 1 to 10 carbon atoms or a substituted or unsubstituted alkylsilyl group (the number of carbon atoms in the alkyl group is preferably 1 to 10, more preferably 1 to 5, and still more preferably 1 to 3).

Meanwhile, the alkylsilyl group refers to a group represented by Formula (X). * represents a bonding location.

$$*-Si(R^a)_{3-m}(R^b)_m \qquad \text{Formula (X)}$$

$R^a$ represents an alkyl group, $R^b$ represents a hydrogen atom, and m represents 0, 1, or 2. Meanwhile, the preferred range of the number of carbon atoms in the alkyl group is as described above.

* represents a linking location to the alkyl group, the alkenyl group, the alkynyl group, the aryl group, the heteroaryl group, or the like included in $R^W$.

Meanwhile, from the viewpoint of the superior effects of the present invention, any one of $R^1$ to $R^{12}$ (preferably any one of $R^5$ to $R^8$) is preferably a group represented by Formula (Y).

$$*\text{—}C\equiv C\text{—}Si(R^a)_{3-m}(R^b)_m \qquad \text{Formula (Y)}$$

The definitions of $R^a$, $R^b$, and m in Formula (Y) are as described above.

From the viewpoint of further improving the symmetry of the molecule and consequently improving the intermolecular interaction, it is preferable that $R^1$ and $R^{12}$ are the same group, $R^2$ and $R^{11}$ are the same group, $R^3$ and $R^{10}$ are the same group, $R^4$ and $R^9$ are the same group, $R^5$ and $R^8$ are the same group, and $R^6$ and $R^7$ are the same group.

The compound represented by General Formula (1) is preferably a compound which is represented by General Formula (3) and has a molecular weight of 3,000 or less, and the compound represented by General Formula (2) is preferably a compound which is represented by General Formula (4) and has a molecular weight of 3,000 or less. Here, the compound represented by General Formula (3) and the compound represented by General Formula (4) are structural isomers.

General Formula (3)

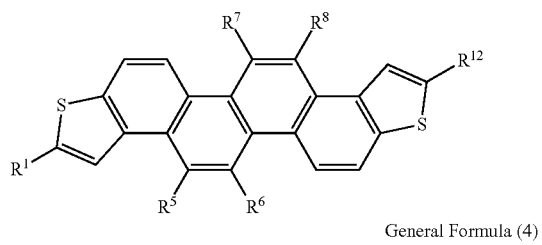

General Formula (4)

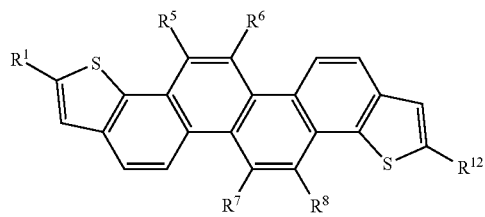

In General Formulae (3) and (4), $R^1$, $R^5$ to $R^8$, and $R^{12}$ each independently represent a group represented by Formula (W).

$$\text{-}L^W\text{-}R^W \qquad \text{(W)}$$

In Formula (W), $L^W$ is a divalent linking group of any of a single bond, —O—, —S—, —NR$^{13}$—, —CO—, —SO—, —SO$_2$—, or —Si(R$^{14}$)(R$^{15}$)— or a divalent linking group obtained by bonding two or more divalent linking groups described above, $R^W$ represents a hydrogen atom, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms, and $R^{13}$ to $R^{15}$ each independently represent a hydrogen atom or an alkyl group, an alkenyl group, an alkynyl group, an aryl group, or a heteroaryl group, all of which may have a substituent.

Here, $R^1$ and $R^{12}$ are the same group, $R^5$ and $R^8$ are the same group, and $R^6$ and $R^7$ are the same group, and any one combination of $R^5$ and $R^8$, and $R^6$ and $R^7$ is a group other than a hydrogen atom.

$R^1$, $R^5$ to $R^8$, $R^{12}$, $L^W$, and $R^W$ in General Formula (3) and General Formula (4) are respectively the same as $R^1$, $R^5$ to $R^8$, $R^{12}$, $L^W$, and $R^W$ in General Formula (1), and the preferred aspects thereof are also identical.

The compound represented by General Formula (3) is preferably a compound which is represented by General Formula (5) and has a molecular weight of 3,000 or less, and the compound represented by General Formula (4) is preferably a compound which is represented by General Formula (6) and has a molecular weight of 3,000 or less. Here, the compound represented by General Formula (5) and the compound represented by General Formula (6) are structural isomers.

General Formula (5)

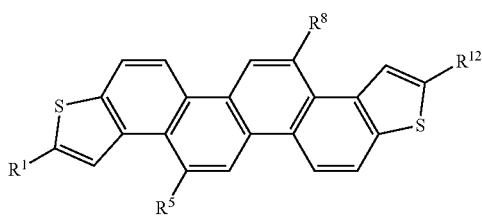

General Formula (6)

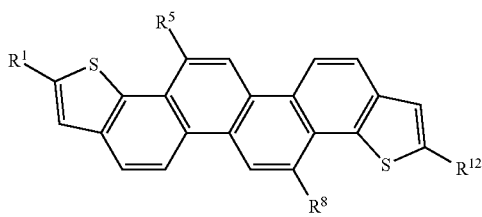

In General Formulae (5) and (6), $R^1$, $R^5$, $R^8$, and $R^{12}$ each independently represent a group represented by Formula (W).

$$\text{-}L^W\text{-}R^W \qquad \text{(W)}$$

In Formula (W), $L^W$ is a divalent linking group of any of a single bond, —O—, —S—, —NR$^{13}$—, —CO—, —SO—, —SO$_2$—, or —Si(R$^{14}$)(R$^{15}$)— or a divalent linking group obtained by bonding two or more divalent linking groups described above, $R^W$ represents a hydrogen atom, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms, $R^{13}$ to $R^{15}$ each independently represent a hydrogen atom or an alkyl group, an alkenyl group, an alkynyl group, an aryl group, or a heteroaryl group, all of which may have a substituent.

Here, $R^1$ and $R^{12}$ are the same group, $R^5$ and $R^8$ are the same group, and the combination of $R^5$ and $R^8$ is a group other than a hydrogen atom.

$R^1$, $R^5$ to $R^8$, $R^{12}$, $L^W$, and $R^W$ in General Formula (5) and General Formula (6) are respectively the same as $R^1$, $R^5$ to $R^8$, $R^{12}$, $L^W$, and $R^W$ in General Formula (1), and the preferred aspects thereof are also identical.

Specific examples of the compound represented by General Formula (1) or General Formula (2) will be illustrated below.

Furthermore, in the following tables, "TMS" represents a trimethylsilyl group, "TIPS" represents triisopropylsilyl group, "TBDMS" represents a tert-butyldimethysilyl group, "Bu" represents a butyl group, "Et" represents an ethyl group, "Pr" represents a propyl group, "Me" represents a methyl group, and "Ph" represents a phenyl group.

TABLE 1

STRUCTURAL FORMULA

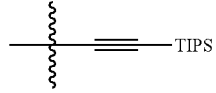

| Specific examples | R1 | R2 | R3 | R4 | R5 | R6 |
|---|---|---|---|---|---|---|
| 1 | Me | H | H | H | 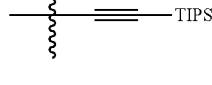 ≡—TIPS | H |
| 2 | H | H | H | H | ≡—TIPS | H |
| 3 | F | H | H | H | ≡—TIPS | H |
| 4 | Ph | H | H | H | ≡—TIPS | H |
| 5 |  | H | H | H | ≡—TIPS | H |
| 6 | 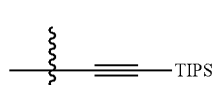 | H | H | H | ≡—TIPS | H |
| 7 | Et | H | H | H | ≡—TIPS | H |
| 8 | i-Pr | H | H | H | ≡—TIPS | H |
| 9 | t-Bu | H | H | H | ≡—TIPS | H |
| 10 | TMS | H | H | H | ≡—TIPS | H |

TABLE 1-continued

STRUCTURAL FORMULA

[Structural formula showing fused ring system with substituents R₁–R₁₂, with two thiophene (S) rings: R₁, R₂ on one thiophene; R₃, R₄, R₅, R₆, R₇, R₈, R₉, R₁₀ on aromatic core; R₁₁, R₁₂ on other thiophene]

| No. | R₁ | R₂ | R₅/R₆ | R₇/R₈ | R₁₁ | R₁₂ |
|---|---|---|---|---|---|---|
| 11 | OMe | H | H | H | —≡—TIPS | H |
| 12 | Me | H | H | H | —≡—TMS | H |
| 13 | F | H | H | H | —≡—TMS | H |
| 14 | Ph | H | H | H | —≡—TMS | H |
| 15 | Me | H | H | H | —≡—TBDMS | H |
| 16 | F | H | H | H | —≡—TBDMS | H |
| 17 | Ph | H | H | H | —≡—TBDMS | H |
| 18 | Me | H | H | H | —≡—n-C₈H₁₇ | H |
| 19 | F | H | H | H | —≡—n-C₈H₁₇ | H |
| 20 | Ph | H | H | H | —≡—n-C₈H₁₇ | H |
| 21 | Me | H | H | H | n-C₁₀H₂₁ | H |
| 22 | F | H | H | H | n-C₁₀H₂₁ | H |
| 23 | Ph | H | H | H | n-C₁₀H₂₁ | H |
| 24 | Me | H | H | H | —CH=CH—n-C₆H₁₃ | H |
| 25 | F | H | H | H | —CH=CH—n-C₆H₁₃ | H |

TABLE 1-continued

STRUCTURAL FORMULA

| No. | R1 | R2 | | | | R12 |
|---|---|---|---|---|---|---|
| 26 | Ph | H | H | H | ⁓CH=CH−n-C₆H₁₃ | H |
| 27 | Me | H | H | H | ⁓C≡C−TIPS | H |
| 28 | H | H | H | H | ⁓C≡C−TIPS | H |
| 29 | F | H | H | H | ⁓C≡C−TIPS | H |
| 30 | Ph | H | H | H | ⁓C≡C−TIPS | H |
| 31 | H | Me | H | H | ⁓C≡C−TIPS | H |
| 32 | H | F | H | H | ⁓C≡C−TIPS | H |
| 33 | H | Ph | H | H | ⁓C≡C−TIPS | H |
| 34 | H | t-Bu | H | H | ⁓C≡C−TIPS | H |
| 35 | Me | H | H | H | H | ⁓C≡C−TIPS |
| 36 | H | H | H | H | H | ⁓C≡C−TIPS |
| 37 | F | H | H | H | H | ⁓C≡C−TIPS |

TABLE 1-continued
STRUCTURAL FORMULA
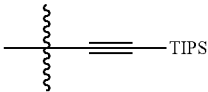
| | | | | | | | |
|---|---|---|---|---|---|---|---|
| 38 | Ph | H | H | H | H | | 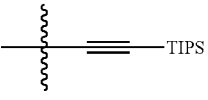 |
| 39 | Me | H | H | H | 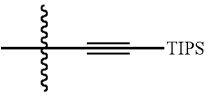 | H | |
| 40 | H | H | H | H |  | H | |
| 41 | F | H | H | H |  | H | |
| 42 | Ph | H | H | H | 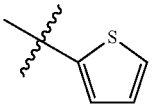 | H | |
| 43 |  | H | H | H | 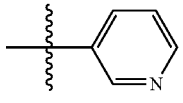 | H | |
| 44 |  | H | H | H |  | H | |
| 45 | Et | H | H | H |  | H | |
| 46 | i-Pr | H | H | H |  | H | |
| 47 | t-Bu | H | H | H |  | H | |
| 48 | TMS | H | H | H |  | H | |
| 49 | OMe | H | H | H | (see below) | H | |

TABLE 1-continued
STRUCTURAL FORMULA
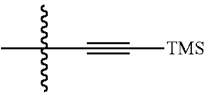 [SMILES: *C#C[Si](C)(C)C]
| | | | | | | |
|---|---|---|---|---|---|---|
| 50 | Me | H | H | H | 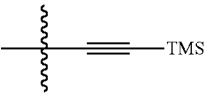 [SMILES: *C#C[Si](C)(C)C]—TMS | H |
| 51 | F | H | H | H | 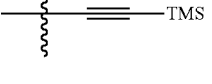—TMS | H |
| 52 | Ph | H | H | H | —TMS | H |
| 53 | Me | H | H | H | —TBDMS | H |
| 54 | F | H | H | H | —TBDMS | H |
| 55 | Ph | H | H | H | —TBDMS | H |
| 56 | Me | H | H | H | —n-C$_8$H$_{17}$ | H |
| 57 | F | H | H | H | 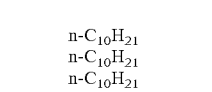—n-C$_8$H$_{17}$ | H |
| 58 | Ph | H | H | H | 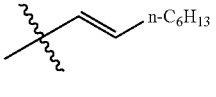—n-C$_8$H$_{17}$ | H |
| 59 | Me | H | H | H | n-C$_{10}$H$_{21}$ | H |
| 60 | F | H | H | H | n-C$_{10}$H$_{21}$ | H |
| 61 | Ph | H | H | H | n-C$_{10}$H$_{21}$ | H |
| 62 | Me | H | H | H | n-C$_6$H$_{13}$ | H |
| 63 | F | H | H | H | n-C$_6$H$_{13}$ | H |
| 64 | Ph | H | H | H | n-C$_6$H$_{13}$ | H |

TABLE 1-continued

STRUCTURAL FORMULA

[Structure showing fused ring system with substituents R1–R12, two thiophene (S) rings, and central polycyclic aromatic core. Positions labeled R3, R4, R7, R8, R11, R12 on top; R1, R2, R5, R6, R9, R10 on bottom.]

| # | R1 | R2 | R3 | R4 | R5/R6/R9 region | R10/R11/R12 region |
|---|----|----|----|----|-----------------|--------------------|
| 65 | Me | H | H | H | ⸺≡⸺TIPS | H |
| 66 | H | H | H | H | ⸺≡⸺TIPS | H |
| 67 | F | H | H | H | ⸺≡⸺TIPS | H |
| 68 | Ph | H | H | H | ⸺≡⸺TIPS | H |
| 69 | H | Me | H | H | ⸺≡⸺TIPS | H |
| 70 | H | F | H | H | ⸺≡⸺TIPS | H |
| 71 | H | Ph | H | H | ⸺≡⸺TIPS | H |
| 72 | H | t-Bu | H | H | ⸺≡⸺TIPS | H |
| 73 | Me | H | H | H | H | ⸺≡⸺TIPS |
| 74 | H | H | H | H | H | ⸺≡⸺TIPS |
| 75 | F | H | H | H | H | ⸺≡⸺TIPS |
| 76 | Ph | H | H | H | H | ⸺≡⸺TIPS |

TABLE 1-continued
STRUCTURAL FORMULA
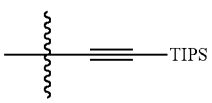
| Specific examples | R7 | R8 | R9 | R10 | R11 | R12 |
|---|---|---|---|---|---|---|
| 1 | H | —≡—TIPS | H | H | H | Me |
| 2 | H | —≡—TIPS | H | H | H | H |
| 3 | H | —≡—TIPS | H | H | H | F |
| 4 | H | —≡—TIPS | H | H | H | Ph |
| 5 | H | —≡—TIPS | H | H | H | 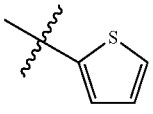 [SMILES: *c1cccs1] |
| 6 | H | —≡—TIPS | H | H | H |  |
| 7 | H | —≡—TIPS | H | H | H | Et |
| 8 | H | —≡—TIPS | H | H | H | i-Pr |
| 9 | H | —≡—TIPS | H | H | H | t-Bu |
| 10 | H | —≡—TIPS | H | H | H | TMS |
| 11 | H | —≡—TIPS | H | H | H | OMe |

TABLE 1-continued

STRUCTURAL FORMULA

[Structural formula showing fused ring system with thiophene rings on both sides, bearing substituents R1–R12 at various positions; R3, R4, R7, R8, R11, R12 on top; R1, R2, R5, R6, R9, R10 on bottom]

| No. | R1 | R2 | R5 | R6 | R9 | R10 | R12 |
|---|---|---|---|---|---|---|---|
| 12 | H | —C≡C—TMS | H | H | H |  | Me |
| 13 | H | —C≡C—TMS | H | H | H |  | F |
| 14 | H | —C≡C—TMS | H | H | H |  | Ph |
| 15 | H | —C≡C—TBDMS | H | H | H |  | Me |
| 16 | H | —C≡C—TBDMS | H | H | H |  | F |
| 17 | H | —C≡C—TBDMS | H | H | H |  | Ph |
| 18 | H | —C≡C—n-$C_8H_{17}$ | H | H | H |  | Me |
| 19 | H | —C≡C—n-$C_8H_{17}$ | H | H | H |  | F |
| 20 | H | —C≡C—n-$C_8H_{17}$ | H | H | H |  | Ph |
| 21 | H | n-$C_{10}H_{21}$ | H | H | H |  | Me |
| 22 | H | n-$C_{10}H_{21}$ | H | H | H |  | F |
| 23 | H | n-$C_{10}H_{21}$ | H | H | H |  | Ph |
| 24 | H | —CH(CH₃)—CH=CH—n-$C_6H_{13}$ | H | H | H |  | Me |
| 25 | H | —CH(CH₃)—CH=CH—n-$C_6H_{13}$ | H | H | H |  | F |
| 26 | H | —CH(CH₃)—CH=CH—n-$C_6H_{13}$ | H | H | H |  | Ph |

TABLE 1-continued

STRUCTURAL FORMULA

| | R1 | R2 | R5 | R6 | R9 | R10 |
|---|---|---|---|---|---|---|
| 27 | H | ⁓–≡–TIPS | H | H | H | H |
| 28 | H | ⁓–≡–TIPS | H | H | H | H |
| 29 | H | ⁓–≡–TIPS | H | H | H | H |
| 30 | H | ⁓–≡–TIPS | H | H | H | H |
| 31 | H | ⁓–≡–TIPS | H | H | Me | H |
| 32 | H | ⁓–≡–TIPS | H | H | F | H |
| 33 | H | ⁓–≡–TIPS | H | H | Ph | H |
| 34 | H | ⁓–≡–TIPS | H | H | t-Bu | H |
| 35 | ⁓–≡–TIPS | H | H | H | H | Me |
| 36 | ⁓–≡–TIPS | H | H | H | H | H |
| 37 | ⁓–≡–TIPS | H | H | H | H | F |
| 38 | ⁓–≡–TIPS | H | H | H | H | Ph |

TABLE 1-continued

STRUCTURAL FORMULA

| | R2 | R1 | R5 | R6 | R9 | R10 | R12 |
|---|---|---|---|---|---|---|---|
| 39 | H | ⟋≡—TIPS | H | H | H | | Me |
| 40 | H | ⟋≡—TIPS | H | H | H | | H |
| 41 | H | ⟋≡—TIPS | H | H | H | | F |
| 42 | H | ⟋≡—TIPS | H | H | H | | Ph |
| 43 | H | ⟋≡—TIPS | H | H | H | | 2-thienyl |
| 44 | H | ⟋≡—TIPS | H | H | H | | 3-pyridyl |
| 45 | H | ⟋≡—TIPS | H | H | H | | Et |
| 46 | H | ⟋≡—TIPS | H | H | H | | i-Pr |
| 47 | H | ⟋≡—TIPS | H | H | H | | t-Bu |
| 48 | H | ⟋≡—TIPS | H | H | H | | TMS |
| 49 | H | ⟋≡—TIPS | H | H | H | | OMe |
| 50 | H | ⟋≡—TMS | H | H | H | | Me |

TABLE 1-continued
STRUCTURAL FORMULA
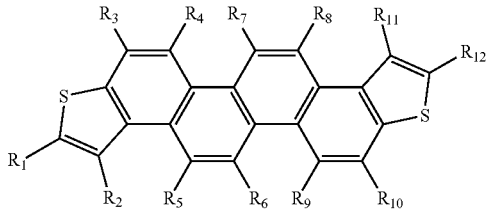
| | R1 | R2 | R5 | R6 | R9 | R12 |
|---|---|---|---|---|---|---|
| 51 | H | 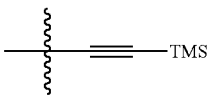—≡—TMS | H | H | H | F |
| 52 | H | 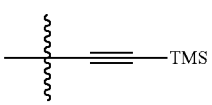 [SMILES: *C#C[Si](C)(C)C]—≡—TMS | H | H | H | Ph |
| 53 | H | 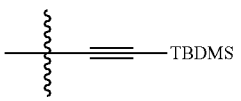—≡—TBDMS | H | H | H | Me |
| 54 | H | 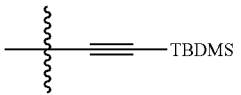—≡—TBDMS | H | H | H | F |
| 55 | H | 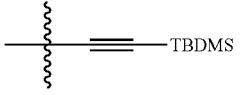—≡—TBDMS | H | H | H | Ph |
| 56 | H | 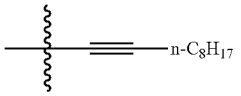—≡—n-C$_8$H$_{17}$ | H | H | H | Me |
| 57 | H | 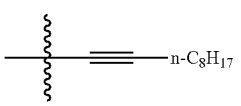—≡—n-C$_8$H$_{17}$ | H | H | H | F |
| 58 | H | 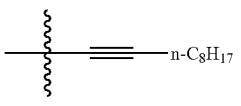—≡—n-C$_8$H$_{17}$ | H | H | H | Ph |
| 59 | H | n-C$_{10}$H$_{21}$ | H | H | H | Me |
| 60 | H | n-C$_{10}$H$_{21}$ | H | H | H | F |
| 61 | H | n-C$_{10}$H$_{21}$ | H | H | H | Ph |
| 62 | H | 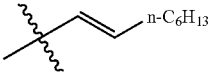n-C$_6$H$_{13}$ | H | H | H | Me |
| 63 | H | 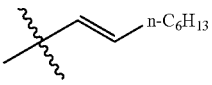n-C$_6$H$_{13}$ | H | H | H | F |
| 64 | H | 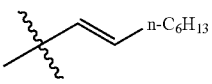n-C$_6$H$_{13}$ | H | H | H | Ph |

TABLE 1-continued

STRUCTURAL FORMULA

| # | | | | | | |
|---|---|---|---|---|---|---|
| 65 | H | ⌇—≡—TIPS | H | H | H | H |
| 66 | H | ⌇—≡—TIPS | H | H | H | H |
| 67 | H | ⌇—≡—TIPS | H | H | H | H |
| 68 | H | ⌇—≡—TIPS | H | H | H | H |
| 69 | H | ⌇—≡—TIPS | H | H | Me | H |
| 70 | H | ⌇—≡—TIPS | H | H | F | H |
| 71 | H | ⌇—≡—TIPS | H | H | Ph | H |
| 72 | H | ⌇—≡—TIPS | H | H | t-Bu | H |
| 73 | ⌇—≡—TIPS | | H | H | H | Me |
| 74 | ⌇—≡—TIPS | | H | H | H | H |
| 75 | ⌇—≡—TIPS | | H | H | H | F |
| 76 | ⌇—≡—TIPS | | H | H | H | Ph |

The method for synthesizing the compound represented by General Formula (1) or General Formula (2) is not particularly limited, and the compound can be synthesized with reference to well-known methods.

Preferred examples of the synthesis method include a method including a step of heating and reacting a compound represented by General Formula (7) or (8) and a compound represented by General Formula (9) in the presence of a transition metal catalyst and an organic solvent.

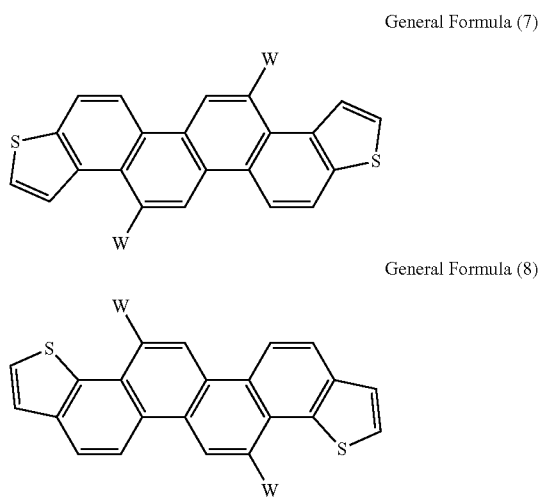

General Formula (7)

General Formula (8)

In General Formula (7) and (8),

W's each independently represents a halogen atom or a perfluoroalkylsulfonyloxy group.

$$R^{11}\text{-}M(R^{12})_i$$    General Formula (9)

In General Formula (9), $R^{11}$ represents an alkyl group, an alkenyl group, an alkynyl group, an aryl group, or a heteroaryl group and may further have a substituent, M represents magnesium, silicon, boron, tin, or zinc, $R^{12}$'s each independently represent a halogen atom an alkyl group, an alkenyl group, an alkynyl group, an alkoxy group, or a hydroxyl group, may be identical to or different from one another, and may form a ring in association with one another, and i represents an integer of 1 to 3, is one smaller than the valence of M; however, in a case in which M is boron, i may be 3.

The transition metal catalyst is not particularly limited, and it is possible to preferably use transition metal catalysts that are used in coupling reactions such as Kumada-Tamao-Corriu coupling, Hiyama coupling, Suzuki-Miyaura coupling, Migita-Kosugi-Stille coupling, Sonogashira-Hagihara coupling, Mizoroki-Heck reactions, or Negishi coupling. Among them, palladium catalysts or nickel catalysts are preferred, and palladium catalysts are more preferred. In addition, the metal catalyst may have an arbitrary ligand depending on reactions.

The organic solvent is not particularly limited and can be appropriately selected depending on matrixes or the catalyst.

In addition, the amounts of the compounds represented by General Formulae (7) to (9), the transition metal catalyst, and the organic solvent used are not particularly limited and may be appropriately selected as necessary.

The heating temperature during reactions is not particularly limited, but is preferably 25° C. to 200° C. and more preferably 40° C. to 150° C.

The number of kinds of the compound represented by General Formula (1) included in the organic semiconductor film of the organic thin-film transistor of the present invention may be one or more, but is preferably one from the viewpoint of the orientation. This is also true in the case of using the compound represented by General Formula (2).

In addition, the number of kinds of the compound represented by General Formula (1) included in an organic semiconductor film, a material for an organic thin-film transistor, or a composition for an organic thin-film transistor described below may be one or more, but is preferably one from the viewpoint of the orientation. This is also true in the case of using the compound represented by General Formula (2).

The total content of the compound represented by General Formula (1) in the organic semiconductor film of the organic thin-film transistor of the present invention is preferably 30% to 100% by mass, more preferably 50% to 100% by mass, and still more preferably 70% to 100% by mass. In addition, in the case of containing no binder polymer described below, the total content is preferably 90% to 100% by mass and more preferably 95% to 100% by mass. This is also true in the case of using the compound represented by General Formula (2).

<Structure of Organic Thin-Film Transistor and Method for Manufacturing Organic Thin-Film Transistor>

Next, the structure of the organic thin-film transistor of the present invention in which the compound represented by General Formula (1) or General Formula (2) is used in the organic semiconductor film of the organic thin-film transistor and a manufacturing method therefor will be described.

The organic thin-film transistor of the present invention has the organic semiconductor film (organic semiconductor layer) including the compound represented by General Formula (1) or General Formula (2) and may further have a source electrode, a drain electrode, and a gate electrode.

The structure of the organic thin-film transistor according to the present invention is not particularly limited and may be any structure of, for example, a bottom contact-type (bottom contact-bottom gate-type and bottom contact-top gate-type) structure, a top contact-type (top contact-bottom gate-type and top contact-top gate-type) structure, or the like.

Hereinafter, an example of the organic thin-film transistor of the present invention will be described with reference to the drawings.

FIG. 1 is a schematic cross-sectional view of a bottom contact-type organic thin-film transistor 100 according to an embodiment of the present invention.

In the example of FIG. 1, the organic thin-film transistor 100 has a substrate (base material) 10, a gate electrode 20, a gate insulating film 30, a source electrode 40, a drain electrode 42, an organic semiconductor film (organic semiconductor layer) 50, and a sealing layer 60. Here, the organic semiconductor film 50 is produced using the compound represented by General Formula (1) or General Formula (2).

Hereinafter, the substrate (base material), the gate electrode, the gate insulating film, the source electrode, the drain electrode, the organic semiconductor film (organic semiconductor layer), and the sealing layer and production methods therefor will be described in detail.

(Substrate)

The substrate plays a role of supporting the gate electrode, the source electrode, the drain electrode, all of which will be described below, or the like.

The kind of the substrate is not particularly limited, and examples thereof include a plastic substrate, a glass substrate, a ceramic substrate, and the like. Among these, from the viewpoint of applicability to individual devices and costs, a glass substrate or a plastic substrate is preferred.

(Gate Electrode)

The material of the gate electrode include metal such as gold (Au), silver, aluminum, copper, chromium, nickel, cobalt, titanium, platinum, magnesium, calcium, barium, and sodium; conductive oxides such as $InO_2$, $SnO_2$, and indium tin oxide (ITO); conductive macromolecules such as polyaniline, polypyrrole, polythiophene, polyacetylene, and polydiacetylene; semiconductors such as silicon, germanium, and gallium arsenide; carbon materials such as fullerene, carbon nanotubes, and graphite; and the like. Among these, metal is preferred, and silver or aluminum is more preferred.

The thickness of the gate electrode is not particularly limited, but is preferably 20 to 200 nm.

Meanwhile, the gate electrode may also function as the substrate, and, in such a case, the above-described substrate may not be provided.

The method for forming the gate electrode is not particularly limited, and examples thereof include a method in which an electrode material is deposited in a vacuum or sputtered on a substrate, a method in which a composition for forming the electrode is applied or printed, and the like. In addition, examples of the patterning method in the case of patterning the electrode include printing methods such as a photolithography method, ink jet printing, screen printing, offset printing, and anastatic printing (flexo printing); a mask deposition method; and the like.

(Gate Insulating Film)

Examples of the material for the gate insulating film include polymers such as polymethyl methacrylate, polystyrene, polyvinyl phenol, polyimide, polycarbonate, polyester, polyvinyl alcohol, polyvinyl acetate, polyurethane, polysulfone, polybenzoxazole, polysilsesquioxane, an epoxy resin, and a phenolic resin; oxides such as silicon dioxide, aluminum oxide, and titanium oxide; nitrides such as silicon nitride; and the like. Among these materials, polymers are preferred from the viewpoint of compatibility with the organic semiconductor film.

The film thickness of the gate insulating film is not particularly limited, but is preferably 100 to 1,000 nm.

The method for forming the gate insulating film is not particularly limited, and examples thereof include a method in which a composition for forming the gate insulating film is applied onto the substrate on which the gate electrode is formed, a method in which a gate insulating film material is deposited or sputtered, and the like.

(Source Electrode and Drain Electrode)

Specific examples of the material of the source electrode and the drain electrode are the same as those for the gate electrode. Among them, metal is preferred, and silver is more preferred.

The method for forming the source electrode and the drain electrode is not particularly limited, and examples thereof include a method in which an electrode material is deposited in a vacuum or sputtered on a substrate on which the gate electrode and the gate insulating film are formed, a method in which a composition for forming the electrode is applied or printed, and the like. Specific examples of the patterning method are the same as those for the gate electrode.

(Organic Semiconductor Film)

The method for producing the organic semiconductor film is not particularly limited as long as organic semiconductor films including the compound represented by General Formula (1) or General Formula (2) can be produced, and, for example, the organic semiconductor film can be produced by applying a composition for the organic thin-film transistor including the compound represented by General Formula (1) or General Formula (2) (described below) on a substrate and drying the composition.

Meanwhile, the application of the composition for the organic thin-film transistor onto a substrate refers not only to an aspect in which the composition for the organic thin-film transistor is directly imparted to a substrate but also to an aspect in which the composition for the organic thin-film transistor is imparted above a substrate through a separate layer provided on the substrate.

As the method for applying the composition for the organic thin-film transistor, well-known methods can be used, and examples thereof include a bar coating method, a spin coating method, a knife coating method, a doctor blade method, an ink jet printing method, a flexo printing method, a gravure printing method, and a screen printing method. Furthermore, as the method for applying the composition for the organic thin-film transistor, the method for forming the organic semiconductor film described in JP2013-207085A (a so-called gap cast method), the method for manufacturing the organic semiconductor film described in WO2014/175351A (a so-called edge cast method or continuous edge cast method), or the like is preferably used.

For drying (drying treatment), the optimal conditions are appropriately selected depending on the kinds of individual components included in the composition for the organic thin-film transistor, and the composition may be naturally dried, but is preferably heated from the viewpoint of improving productivity. For example, the heating temperature is preferably 30° C. to 200° C. and more preferably 40° C. to 150° C., and the heating time is preferably 10 to 300 minutes and more preferably 30 to 180 minutes.

The film thickness of the organic semiconductor film being produced is not particularly limited, but is preferably 10 to 500 nm and more preferably 20 to 200 nm since the effects of the present invention are more favorable.

As described above, the organic semiconductor film containing the compound represented by General Formula (1) or General Formula (2) is preferably used in the organic thin-film transistor, but the use thereof is not limited thereto, and the organic semiconductor film containing the compound represented by General Formula (1) or General Formula (2) can also be applied to other uses described below.

(Sealing Layer)

From the viewpoint of durability, the organic thin-film transistor of the present invention preferably includes a sealing layer in the outermost layer. For the sealing layer, a well-known sealing agent (composition for forming the sealing layer) can be used.

The thickness of the sealing layer is not particularly limited, but is preferably 0.2 to 10 μm.

(Other Organic Thin-Film Transistors)

Figure 2:
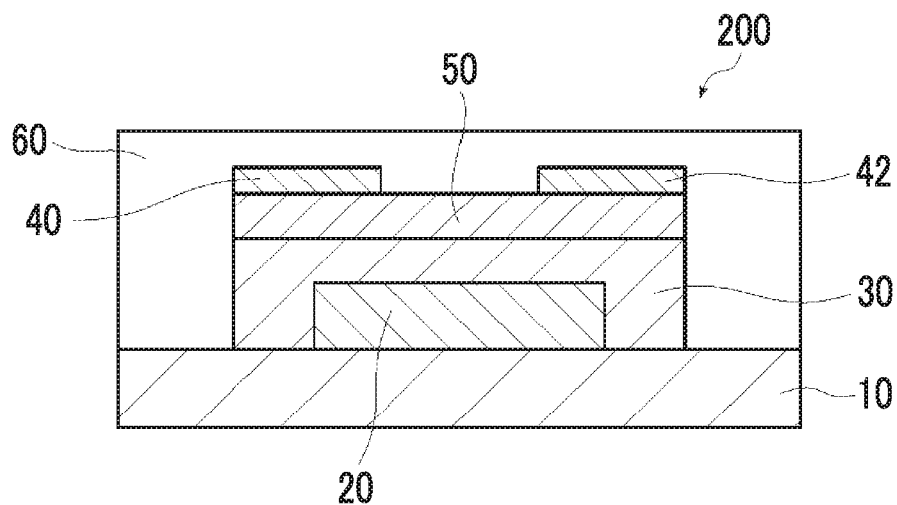
FIG. 2 is a schematic cross-sectional view of a top contact-type organic thin-film transistor according to an embodiment of the present invention.

FIG. 2 is a schematic cross-sectional view of a top contact-type organic thin-film transistor 200 according to an embodiment of the present invention.

In the example of FIG. 2, the organic thin-film transistor 200 has the substrate 10, the gate electrode 20, the gate insulating film 30, the source electrode 40, the drain electrode 42, the organic semiconductor film (organic semiconductor layer) 50, and the sealing layer 60. Here, the organic semiconductor film 50 is formed using a composition for an organic thin-film transistor of the present invention described below.

The substrate, the gate electrode, the gate insulating film, the source electrode, the drain electrode, the organic semiconductor film, and the sealing layer have already been described above and thus will not be described again.

(Applications of Organic Thin-Film Transistor)

The organic thin-film transistor can be singly used as switching elements. In addition, the organic thin-film transistor can be used for, for example, electronic paper, display portions that display images of display devices, light-receiving portions that receive the light of images of X-ray flat panel detectors, and the like by arraying a plurality of elements on a matrix. In addition, the organic thin-film transistor can be applied to small-sized circuits such as inverters, ring oscillators, and d-flip-flops or logic circuits such as radio frequency identifiers (RFID, RF tags) or memories by combining a plurality of elements. The respective devices may have a well-known structure, and thus the structures thereof will not be described.

[Composition for Organic Thin-Film Transistor]

A composition for an organic thin-film transistor of the present invention is used to produce the organic semiconductor film of the organic thin-film transistor.

Meanwhile, the composition for an organic thin-film transistor which will be described below may be used for other uses described below, and, in such cases, the "composition for an organic thin-film transistor" will be simply referred to as "organic semiconductor composition".

The composition for an organic thin-film transistor contains the compound represented by General Formula (1) or General Formula (2) and, generally, further contains an organic solvent from the viewpoint of improving the coatability.

In the case of containing an organic solvent, the content thereof is preferably 0.01% to 80% by mass, more preferably 0.05% to 10% by mass, and still more preferably 0.1% to 5% by mass with respect to the total mass of the composition for an organic thin-film transistor from the viewpoint of improving the coatability.

(Organic Solvent)

The organic solvent is not particularly limited, and examples thereof include hydrocarbon-based solvents such as hexane, octane, decane, toluene, xylene, mesitylene, ethylbenzene, decalin, tetralin, 2-methyl benzothiazole, and 1-methyl naphthalene, ketone-based solvents such as acetone, methyl ethyl ketone, methyl isobutyl ketone, and cyclohexanone, halogenated hydrocarbon-based solvents such as dichloromethane, chloroform, tetrachloromethane, dichloroethane, trichloroethane, tetrachloroethane, chlorobenzene, dichlorobenzene, 1,2-dichlorobenzene, 1-fluoronaphthalene, 2,5-dichlorothiophene, 2,5-dibromothiophene, 1-chloronaphthalene, and chlorotoluene, ester-based solvents such as ethyl acetate, butyl acetate, amyl acetate, and ethyl lactate, alcohol-based solvents such as methanol, propanol, butanol, pentanol, hexanol, cyclohexanol, methyl cellosolve, ethyl cellosolve, and ethylene glycol, ether-based solvents such as butoxybenzene, dibutyl ether, tetrahydrofuran, dioxane, and anisole, amide-based solvents such as N,N-dimethyl formamide and N,N-dimethylacetamide, imide-based solvents such as 1-methyl-2-pyrrolidone and 1-methyl-2-imidazolidinone, sulfoxide-based solvents such as dimethyl sulfoxide, nitrile-based solvents such as acetonitrile, and the like.

The organic solvent may be used singly or two or more solvents may be jointly used.

(Binder Polymer)

The composition for an organic thin-film transistor may further contain a binder polymer.

The kind of the binder polymer is not particularly limited, and well-known binder polymers can be used. Examples of the binder polymer include insulating polymers such as polystyrene, polycarbonate, polyarylate, polyester, polyamide, polyimide, polyurethane, polysiloxane, polysulfone, polymethyl methacrylate, polymethyl acrylate, cellulose, polyethylene, and polypropylene and copolymers thereof; rubber or thermoplastic elastomers such as ethylene-propylene rubber, acrylonitrile-butadiene rubber, hydrogenated nitrile rubber, fluororubber, a perfluoroelastomer, a tetrafluoroethylene propylene copolymer, an ethylene-propylenediene copolymer, styrene-butadiene rubber, polychloroprene, polyneoprene, butyl rubber, a methyl phenyl silicone resin, a methyl phenyl vinyl silicone resin, a methyl vinyl silicone resin, a fluorosilicone resin, acrylic rubber, ethylene acrylic rubber, chlorosulfonated polyethylene, chloropolyethylene, an epichlorohydrin copolymer, a polyisoprene-natural rubber copolymer, polyisoprene rubber, a styrene-isoprene block copolymer, a polyether urethane copolymer, a polyether ester thermoplastic elastomer, and polybutadiene rubber; photoconductive polymers such as polyvinyl carbazole and polysilane; conductive polymers such as polythiophene, polypyrrole, polyaniline, and polyparaphenylene vinylene; and semiconductor polymers described in, for example, Chemistry of Materials, 2014, 26, 647.

The polymer binder may be used singly or a plurality of polymer binders may be jointly used.

Among these, the binder polymer is preferably a macromolecular compound having a benzene ring (a macromolecule having a monomer unit having a benzene ring). The content of the monomer unit having a benzene ring is not particularly limited, but is preferably 50% by mole or more, more preferably 70% by mole or more, and still more preferably 90% by mole or more. The upper limit is not particularly limited, but is, for example, 100% by mole.

Specific examples of the binder polymer include polystyrene, poly($\alpha$-methylstyrene), polyvinyl cinnamate, poly(4-vinylphenyl), poly(4-methylstyrene), poly[bis(4-phenyl)(2,4,6-trimethylphenyl)amine], and poly[2,6-(4,4-bis(2-ethylhexyl)-4Hcyclopenta[2,1-b;3,4-b']dithophene)-alt-4,7-(2,1,3-benzothiazole)], and the like, polystyrene or poly($\alpha$-methylstyrene) is more preferred, and poly($\alpha$-methylstyrene) is still more preferred.

The weight-average molecular weight of the binder polymer is not particularly limited, but is preferably 1,000 to 2,000,000, more preferably 3,000 to 1,000,000, and still more preferably 5,000 to 600,000.

In the case of containing the binder polymer, the content is preferably 1 to 10,000 parts by mass, more preferably 10 to 1,000 parts by mass, still more preferably 25 to 400 parts by mass, and most preferably 50 to 200 parts by mass with respect to 100 parts by mass of the compound represented by General Formula (1) or General Formula (2) included in the composition for an organic thin-film transistor. In the above-described range, the carrier mobility of organic semiconductor films and organic semiconductor elements to be obtained and the uniformity of films are superior.

(Other Components)

The composition for an organic thin-film transistor may contain components other than the components described above. As the other components, well-known additives and the like can be used.

(Preparation Method)

The method for preparing the composition for an organic thin-film transistor is not particularly limited and well-known methods can be used. For example, a predetermined amount of the compound represented by General Formula (1) or General Formula (2) and the like are added to the organic solvent, and a stirring treatment is appropriately carried out, whereby the composition for an organic thin-film transistor of the present invention can be obtained.

[Material for Organic Thin-Film Transistor]

A material for an organic thin-film transistor of the present invention contains the compound represented by General Formula (1) or General Formula (2). The material for an organic thin-film transistor refers to a material which is used for organic thin-film transistors and exhibits the characteristics of semiconductors.

The compound represented by General Formula (1) or General Formula (2) is a material exhibiting the properties of semiconductors and is a p-type (hole transport-type) organic semiconductor material that conducts electricity using electrons as carriers.

Meanwhile, the material for an organic thin-film transistor may be used for other uses described below, and, in such cases, the "material for an organic thin-film transistor" will be simply referred to as "organic semiconductor material".

[Other Uses of Compound Represented by General Formula (1) or General Formula (2)]

The compound represented by General Formula (1) or General Formula (2) has excellent properties as described above and thus can also be preferably used for uses other than organic thin-film transistors.

Examples of the other uses include non-luminous organic semiconductor devices. The non-luminous organic semiconductor devices refer to devices that are not intended to emit light.

Examples of the non-luminous organic semiconductor devices include, in addition to the above-described organic thin-film transistor, organic photoelectric conversion elements (solid image pickup elements for light sensors, solar batteries for energy conversion, and the like), gas sensors, organic rectifier cells, information recording elements, and the like.

In the non-luminous organic semiconductor devices, the organic semiconductor film is preferably caused to function as an electronics element. The scope of the organic semiconductor film includes organic semiconductor films including the compound represented by General Formula (1) or General Formula (2).

EXAMPLES

Hereinafter, the characteristics of the present invention will be more specifically described using examples and comparative examples. Materials, amounts used, proportions, processing contents, processing orders, and the like described in the following examples can be appropriately modified within the scope of the gist of the present invention. Therefore, the scope of the present invention is not supposed to be restrictively interpreted by specific examples described below.

Examples 1 to 6 and Comparative Examples 1 to 3

Synthesis Examples

Compound 1

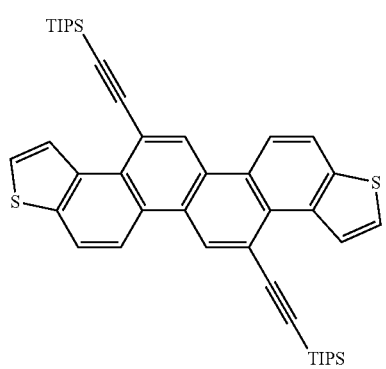

-continued

Compound 2

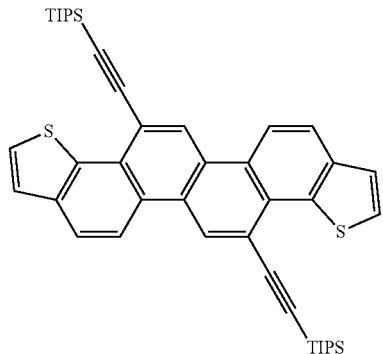

Compound 3

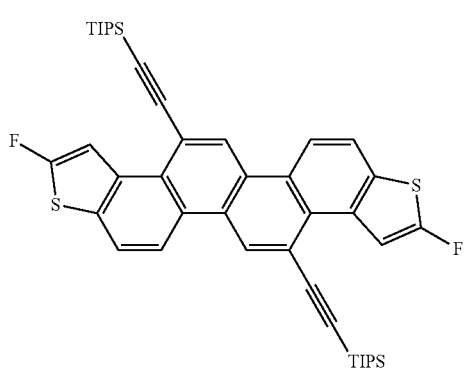

Compound 4

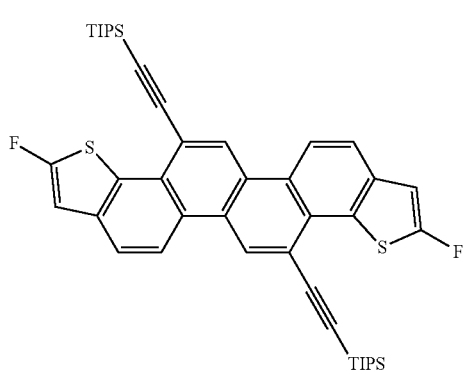

Compound 5

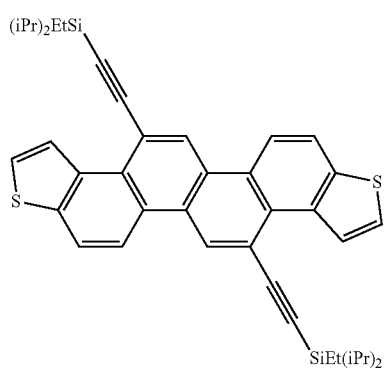

Compound 6
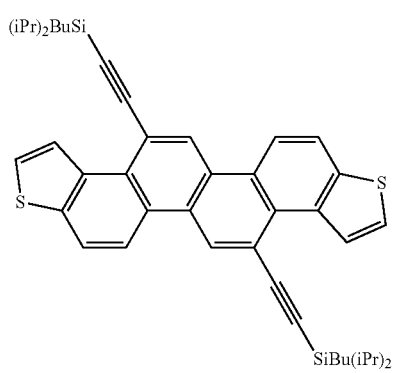
<Synthesis of Compound 1>
A compound 1 which is the compound represented by General Formula (1) was synthesized according to a specific synthesis order illustrated in the following scheme.
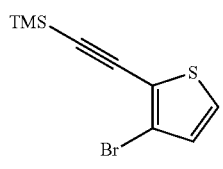
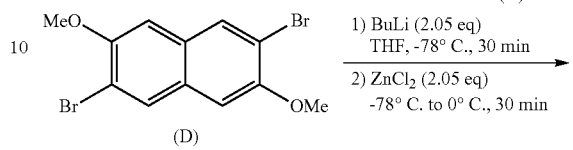
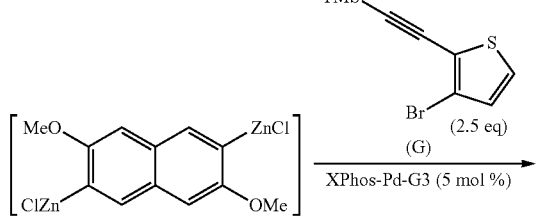
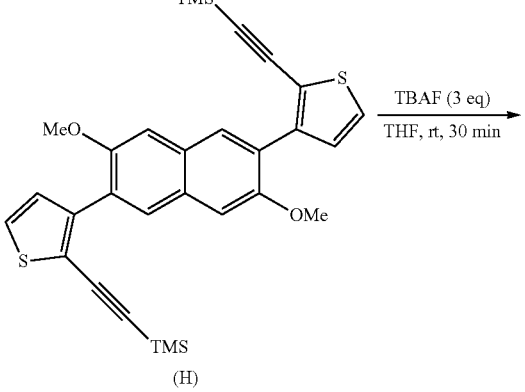

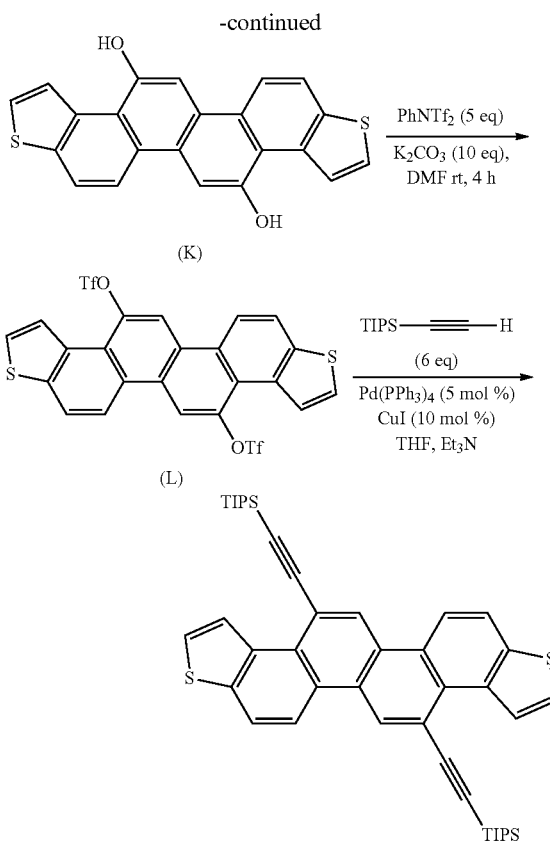

(K)

(L)

Hereinafter, each of specific synthesis orders will be described in detail.

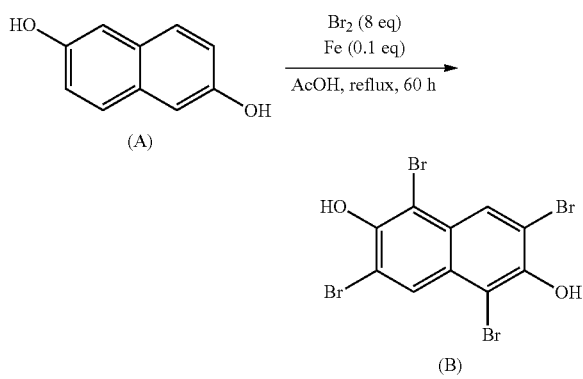

(A)

(B)

Bromine (159 g, 1 mol) was added dropwise to an acetic acid (500 mL) solution of a compound (A) (40 g, 0.25 mol), and the solution was heated and refluxed at 120° C. for five hours. After that, iron powder (1.2 g, 0.025 mol) was added thereto, furthermore, bromine (159 g, 1 mol) was added thereto at room temperature, and the solution was heated and refluxed for 55 hours. Water was added to this reaction solution, the precipitated solid was filtered, and the obtained solid was washed with acetone. This solid was recrystallized with 1,4-dioxane, thereby obtaining a compound (B) (61 g, yield: 51%) in a white solid form.

$^1$H NMR (Nuclear Magnetic Resonance) (400 MHz, Acetone-d$^6$, ppm): δ 8.32 (s, 2H)

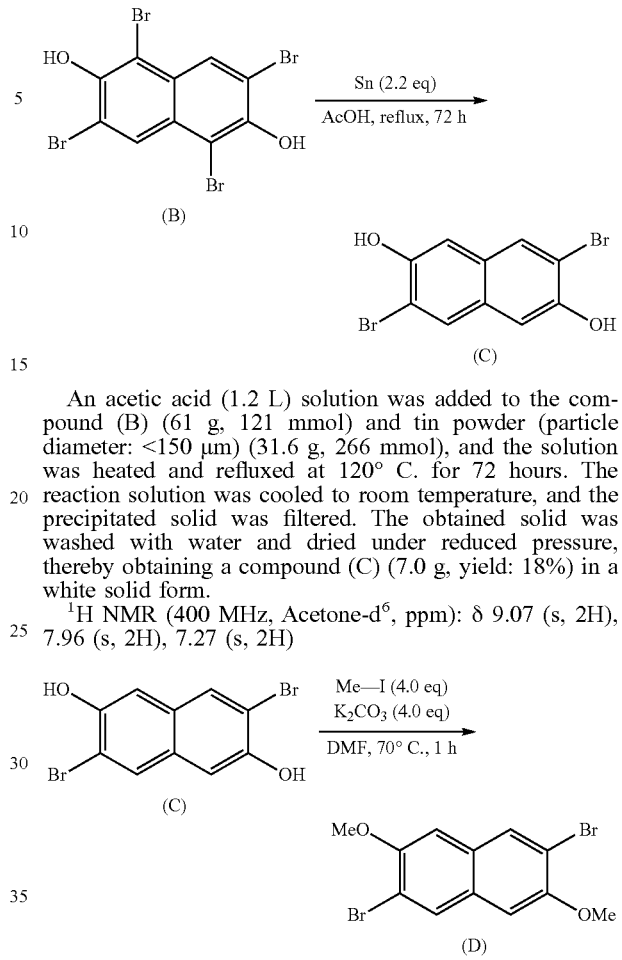

(B)

(C)

An acetic acid (1.2 L) solution was added to the compound (B) (61 g, 121 mmol) and tin powder (particle diameter: <150 μm) (31.6 g, 266 mmol), and the solution was heated and refluxed at 120° C. for 72 hours. The reaction solution was cooled to room temperature, and the precipitated solid was filtered. The obtained solid was washed with water and dried under reduced pressure, thereby obtaining a compound (C) (7.0 g, yield: 18%) in a white solid form.

$^1$H NMR (400 MHz, Acetone-d$^6$, ppm): δ 9.07 (s, 2H), 7.96 (s, 2H), 7.27 (s, 2H)

(C)

(D)

In an argon atmosphere, the compound (C) (7.0 g, 22 mmol) and potassium carbonate (12 g, 88 mmol) were dissolved in N,N-dimethylformamide (60 mL), methyl iodide (5.5 mL, 88 mmol) was added thereto at room temperature, and the solution was heated and stirred at 70° C. for one hour. Water was added to this reaction solution, and the precipitated solid was filtered and dried under reduced pressure, thereby obtaining a roughly purified substance of the compound (D). This roughly purified substance was purified by means of silica gel column chromatography (hexane:dichloromethane), thereby obtaining a compound (D) (5.7 g, yield: 75%) in a white solid form.

$^1$H NMR (400 MHz, CDCl$_3$, ppm): δ 7.93 (s, 2H), 7.00 (s, 2H), 3.95 (s, 6H)

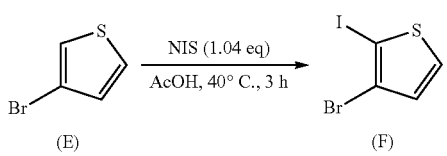

(E)

(F)

In an argon atmosphere, a compound (E) (70.0 g, 429 mmol) was dissolved in acetic acid (600 mL), N-iodosuccinimide (100 g, 446 mmol) was added thereto, and the solution was heated and stirred at 40° C. Water was added to this reaction solution, and a roughly purified substance of a compound (F) was obtained by means of extraction using hexane. This roughly purified substance was purified by means of distillation under reduced pressure, thereby obtaining the compound (F) (57.6 g, yield: 46%) in a white oil form.

¹H NMR (400 MHz, CDCl₃, ppm): δ 7.39 (d, J=5.6 Hz, 1H), 6.88 (d, J=5.6 Hz, 1H)

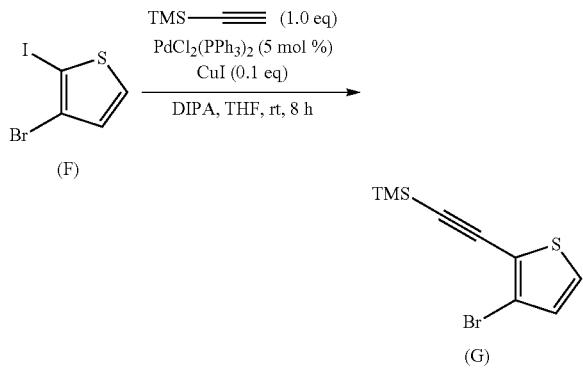

In an argon atmosphere, a solution mixture of diisopropylamine (700 mL) and tetrahydrofuran (700 mL) was added to the compound (F) (57.6 g, 199 mmol), copper iodide (3.80 g, 19.9 mmol), and bis(triphenylphosphine) palladium (II) dichloride (7.00 g, 9.97 mmol). Next, trimethylsilylacetylene (27.6 mL, 199 mmol) was added thereto, and the solution was stirred at room temperature for eight hours. Water was added to this reaction solution, and a roughly purified substance of a compound (G) was obtained by means of extraction using hexane. This roughly purified substance was purified by means of column chromatography (hexane), thereby obtaining the compound (G) (36.6 g, yield: 70%) in a light yellow oil form.

¹H NMR (400 MHz, CDCl₃, ppm): δ 7.15 (d, J=5.6 Hz, 1H), 6.92 (d, J=5.6 Hz, 1H), 0.25 (s, 9H)

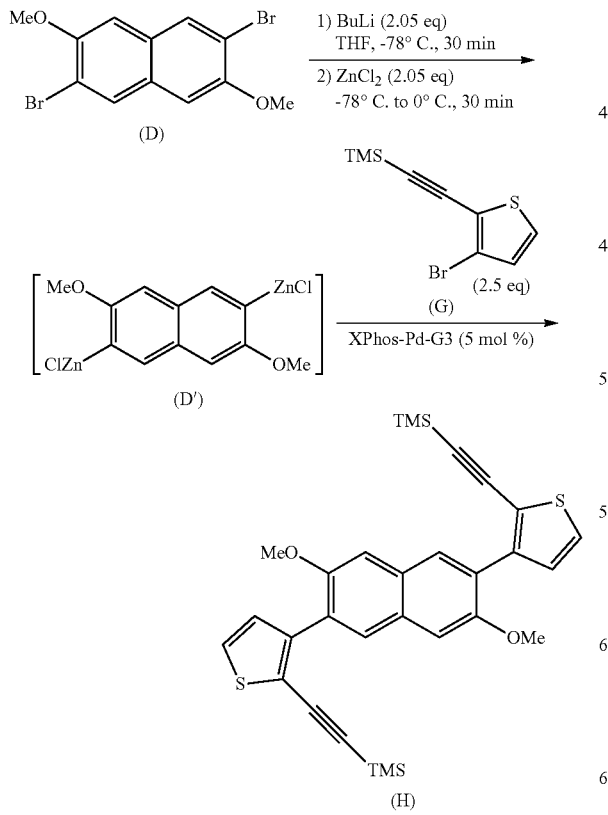

In an argon atmosphere, n-butyllithium (a hexane solution, 1.6 M) (9.26 mL, 14.8 mmol) was added dropwise to a tetrahydrofuran 90 mL solution of the compound (D) (2.50 g, 7.23 mmol) at −78° C. and stirred for 30 minutes at −78° C. After that, zinc chloride (a tetrahydrofuran solution, 1.0 M) (14.8 mL, 14.8 mmol) was added dropwise thereto and heated from −78° C. to 0° C. This reaction liquid was stirred at 0° C. for 30 minutes, thereby producing a solution mixture of a compound (D'). The compound (G) (4.68 g, 18.1 mmol) and XPhos-Pd-G3 ((2-Dicyclohexylphosphino-2',4',6'-triisopropyl-1,1'-biphenyl)[2-(2'-amino-1,1'-biphenyl)]palladium (II) methanesulfonate) (306 mg, 0.36 mmol) was added to this solution mixture, and the solution was heated and refluxed at 70° C. for one hour. Water was added to this reaction solution, and a roughly purified substance of a compound (H) was obtained by means of extraction using chloroform. This roughly purified substance was purified by means of column chromatography (hexane:chloroform), thereby obtaining the compound (H) (2.60 g, yield: 66%) in a white solid form.

¹H NMR (400 MHz, CDCl₃, ppm): δ 8.06 (s, 2H), 7.32 (d, J=4.8 Hz, 2H), 7.23 (d, J=4.8 Hz, 2H), 7.14 (s, 2H), 3.88 (s, 6H), 0.15 (s, 18H)

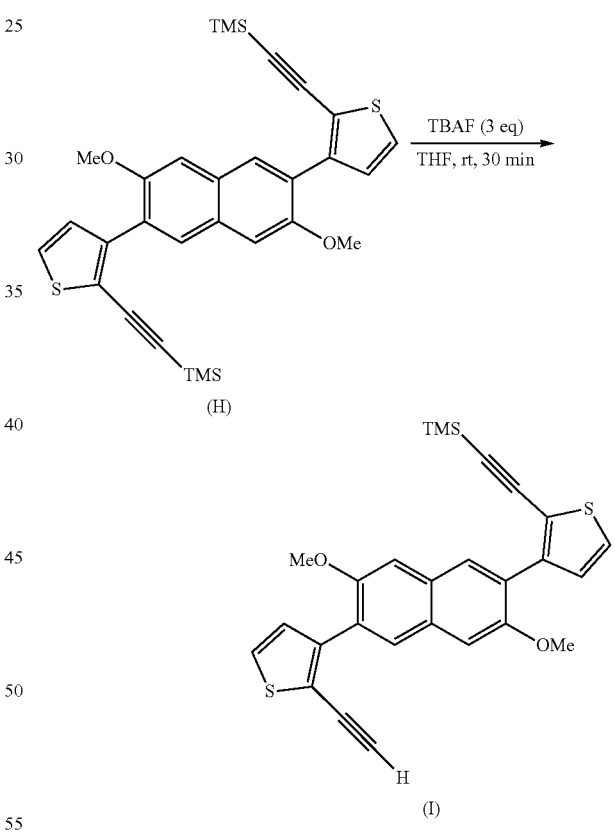

In an argon atmosphere, tetrabutylammonium fluoride (a tetrahydrofuran solution, 1.0 M) (14.3 mL, 14.3 mmol) was added to a tetrahydrofuran solution of the compound (H) (2.60 g, 4.77 mmol), and the solution was stirred at room temperature for 30 minutes. Water was added to this reaction solution, and a compound (I) (1.89 g, yield: 99%) was obtained in a white solid form by means of extraction using chloroform.

¹H NMR (400 MHz, C₂D₂Cl₄, ppm): δ 7.95 (s, 2H), 7.29 (d, J=4.8 Hz, 2H), 7.27 (d, J=4.8 Hz, 2H), 7.18 (s, 2H), 3.90 (s, 6H), 3.39 (s, 2H)

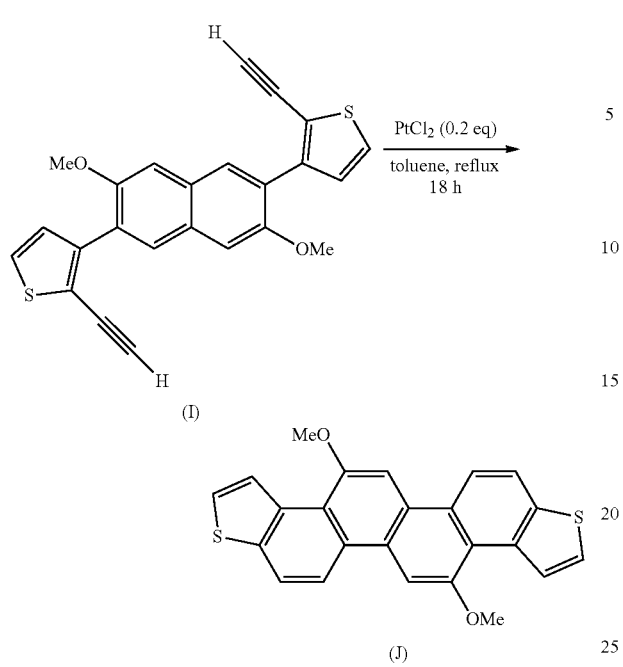

(I)

(J)

In an argon atmosphere, toluene (200 mL) was added to the compound (I) (6.1 g, 15.2 mmol) and platinum (II) chloride (810 mg, 3.05 mmol), and the solution was heated and refluxed at 120° C. for 18 hours. This reaction solution was purified by means of silica gel column chromatography (toluene) and then gel permeation chromatography (GPC), thereby obtaining a compound (J) (960 mg, yield: 15%) in a yellow solid form.

$^1$H NMR (400 MHz, $C_2D_2Cl_4$, ppm): δ 8.72 (d, J=5.6 Hz, 2H), 8.68 (d, J=8.8 Hz, 2H), 8.19 (d, J=8.8 Hz, 2H), 7.13 (s, 2H), 7.66 (d, J=5.6 Hz, 2H), 4.31 (s, 6H)

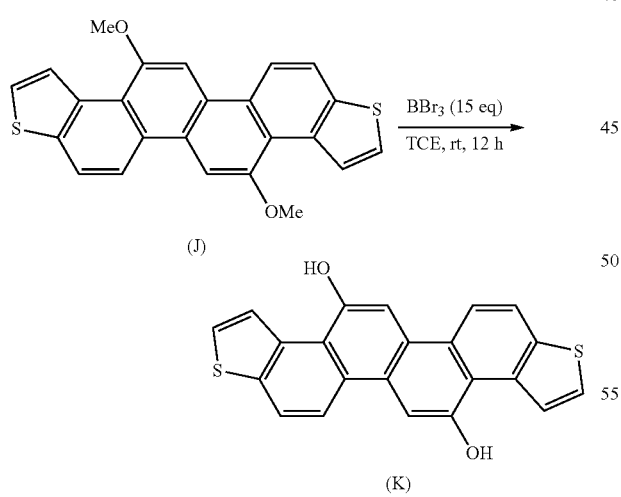

(J)

(K)

In an argon atmosphere, boron tribromide (a dichloromethane solution, 1.0 M) (27.3 mL, 27.3 mmol) was added to a 1,1,2,2-tetrachloroethane 30 mL solution of the compound (J) (730 mg, 1.82 mmol), and the solution was stirred at room temperature for 12 hours. A small amount of methanol was added to this reaction solution, and the solvent was distilled under reduced pressure. The obtained solid was washed with methanol, thereby obtaining a compound (K) (650 mg) which was a roughly purified substance in a yellow solid form. The compound was used in the following reaction as it was.

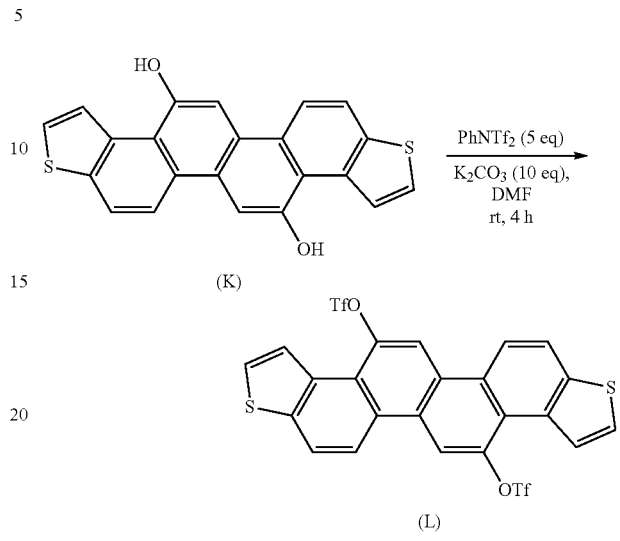

(K)

(L)

In an argon atmosphere, N,N-bis(trifluoromethylsulfonyl)aniline (3.12 g, 8.73 mmol) was added to a N,N-dimethylformamide 50 mL solution of the compound (K) (650 mg, 1.75 mmol) and potassium carbonate (2.41 g, 17.5 mmol) at 0° C., and the solution was stirred at room temperature for four hours. Methanol was added to this reaction solution, the precipitate was filtered and washed with methanol, thereby obtaining a compound (L) (550 mg, two-step yield: 58%) in a yellow solid form.

$^1$H NMR (400 MHz, $C_2D_2Cl_4$, ppm): δ 8.85 (s, 2H), 8.59 (d, J=8.4 Hz, 2H), 8.45 (d, J=5.6 Hz, 2H), 8.33 (d, J=8.4 Hz, 2H), 7.85 (d, J=5.6 Hz, 2H)

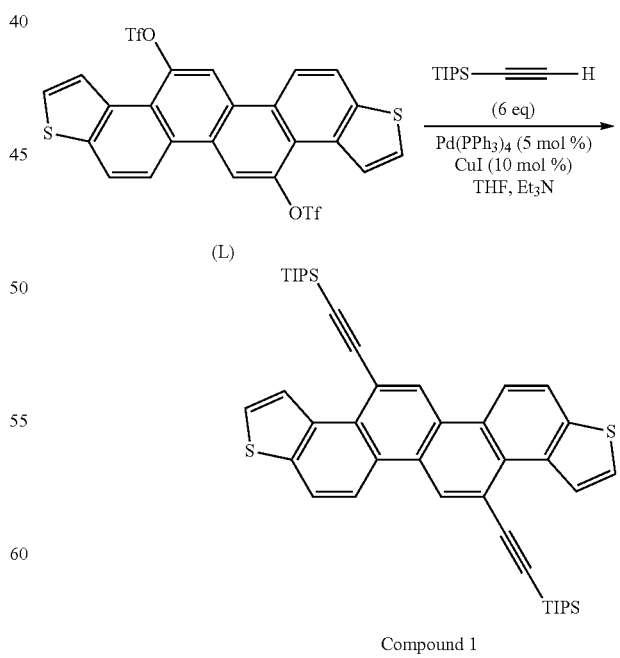

(L)

Compound 1

In an argon atmosphere, a solution mixture of triethylamine (3.0 mL) and tetrahydrofuran (6.0 mL) was added to the compound (L) (300 mg, 0.47 mmol), copper iodide (9.0 mg, 0.047 mmol), and tetrakis(triphenylphosphine) palladium (27 mg, 0.024 mmol). Next, triisopropylsilylacetylene (0.63 mL, 2.82 mmol) was added thereto, and the solution was heated and refluxed at 70° C. for four hours. Methanol was added to this reaction solution, and the precipitated solid was filtered. The obtained solid was purified by means of GPC, thereby obtaining the compound 1 (210 mg, yield: 64%) in a yellow solid form.

$^1$H NMR (400 MHz, CDCl$_3$, ppm): δ 9.66 (d, J=5.6 Hz, 2H), 9.13 (s, 2H), 8.74 (d, J=8.8 Hz, 2H), 8.21 (d, J=8.8 Hz, 2H), 7.59 (d, J=5.6 Hz, 2H), 1.37-1.21 (m, 21H)

<Synthesis of Compound 2>

A compound 2 which is the compound represented by General Formula (2) was synthesized according to a specific synthesis order illustrated in the following scheme.

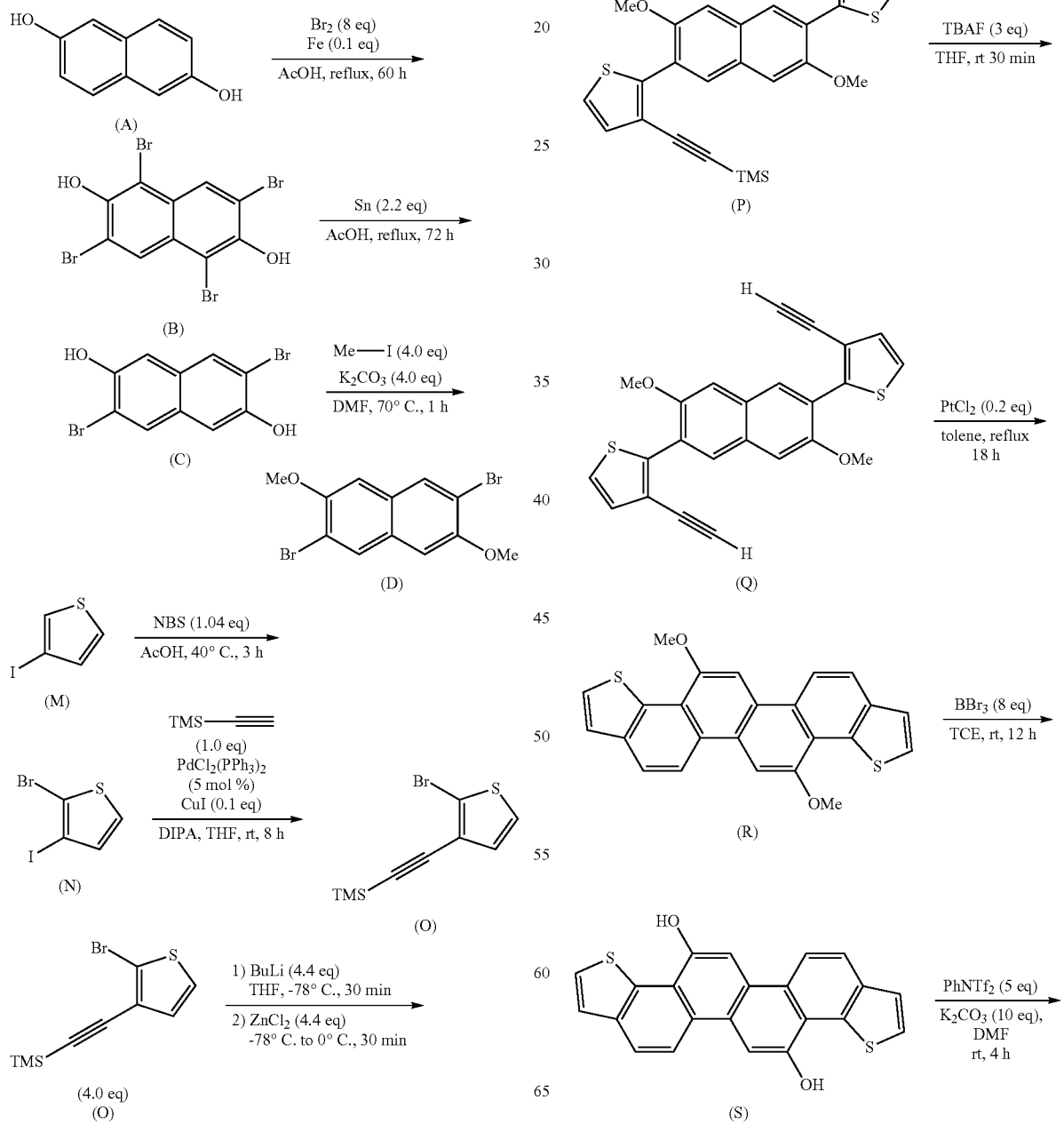

-continued

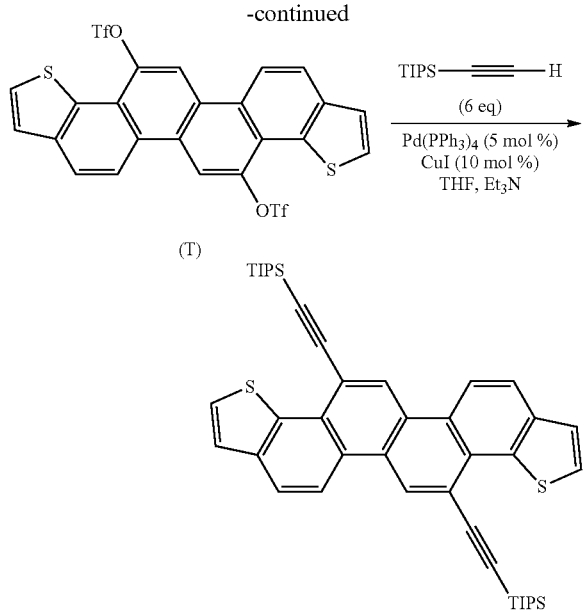

(T)

Hereinafter, each of specific synthesis orders will be described in detail.

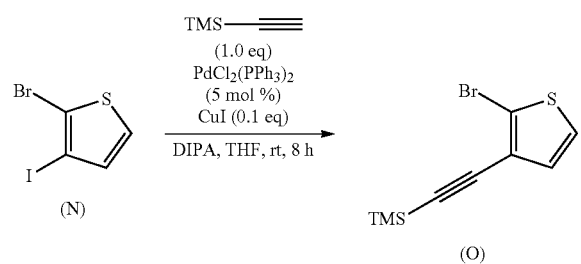

In an argon atmosphere, a compound (M) (35.0 g, 167 mmol) was dissolved in acetic acid (300 mL), N-boromosuccinimide (30.8 g, 173 mmol) was added thereto, and the solution was heated and stirred at 40° C. Water was added to this reaction solution, and a roughly purified substance of a compound (N) was obtained by means of extraction using hexane. This roughly purified substance was purified by means of column chromatography (hexane), thereby obtaining the compound (N) (39.5 g, yield: 82%) in a colorless oil form.

In an argon atmosphere, a solution mixture of diisopropylamine (300 mL) and tetrahydrofuran (300 mL) was added to the compound (N) (39.5 g, 137 mmol), copper iodide (2.60 g, 13.7 mmol), and bis(triphenylphosphine) palladium (II) dichloride (4.79 g, 6.84 mmol). Next, trimethylsilylacetylene (18.9 mL, 137 mmol) was added thereto, and the solution was stirred at room temperature for eight hours. Water was added to this reaction solution, and a roughly purified substance of a compound (O) was obtained by means of extraction using hexane. This roughly purified substance was purified by means of column chromatography (hexane), thereby obtaining the compound (O) (26.0 g, yield: 73%) in a light yellow oil form.

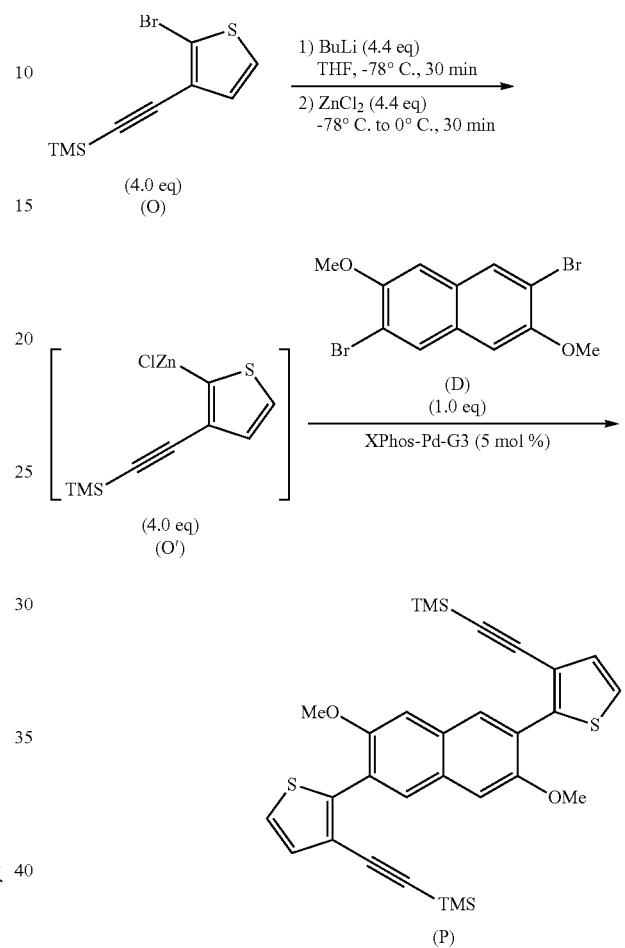

In an argon atmosphere, n-butyllithium (a hexane solution, 1.6 M) (79.5 mL, 127 mmol) was added dropwise to a tetrahydrofuran 90 mL solution of the compound (O) (30.0 g, 116 mmol) at −78° C. and stirred for 30 minutes at −78° C. After that, zinc chloride (a tetrahydrofuran solution, 1.0 M) (127 mL, 127 mmol) was added dropwise thereto and heated from −78° C. to 0° C. This reaction liquid was stirred at 0° C. for 30 minutes, thereby producing a solution mixture of a compound (O'). The compound (D) (10.0 g, 28.9 mmol) and XPhos-Pd-G3 (1.22 g, 1.44 mmol) was added to this solution mixture, and the solution was heated and refluxed at 70° C. for one hour.

Water was added to this reaction solution, and a roughly purified substance of a compound (P) was obtained by means of extraction using chloroform. This roughly purified substance was purified by means of column chromatography (hexane:chloroform), thereby obtaining the compound (P) (8.40 g, yield: 53%) in a white solid form.

$^1$H NMR (400 MHz, CDCl$_3$, ppm): δ 8.38 (s, 2H), 7.27 (d, J=5.6 Hz, 2H), 7.15 (d, J=5.6 Hz, 2H), 7.15 (s, 2H), 3.93 (s, 6H), 0.18 (s, 18H)

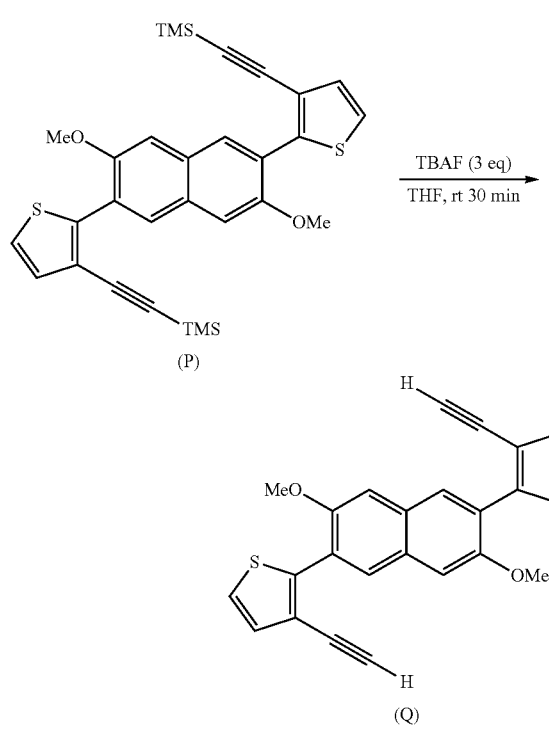

(P)

(Q)

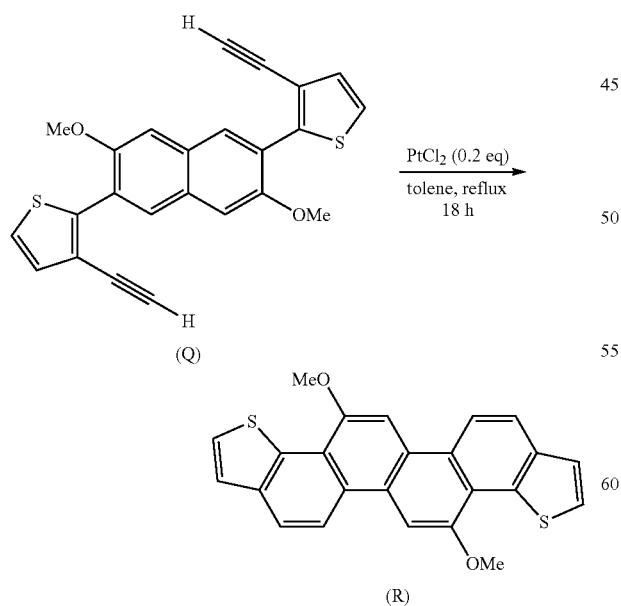

In an argon atmosphere, tetrabutylammonium fluoride (a tetrahydrofuran solution, 1.0 M) (46.0 mL, 46.0 mmol) was added to a tetrahydrofuran solution of the compound (P) (8.35 g, 15.3 mmol), and the solution was stirred at room temperature for 30 minutes. Water was added to this reaction solution, and a compound (Q) (4.68 g, yield: 76%) was obtained in a white solid form by means of extraction using chloroform.

$^1$H NMR (400 MHz, CDCl$_3$, ppm): δ 8.12 (s, 2H), 7.30 (d, J=5.2 Hz, 2H), 7.18 (d, J=5.2 Hz, 2H), 7.18 (s, 2H), 3.93 (s, 6H), 3.07 (s, 2H)

In an argon atmosphere, toluene (230 mL) was added to the compound (Q) (4.60 g, 11.5 mmol) and platinum (II) chloride (612 mg, 2.30 mmol), and the solution was heated and refluxed at 120° C. for 18 hours. This reaction solution was purified by means of silica gel column chromatography (toluene) and then gel permeation chromatography (GPC), thereby obtaining a compound (R) (1.35 g, yield: 29%) in a yellow solid form.

$^1$H NMR (400 MHz, CDCl$_3$, ppm): δ 8.66 (d, J=8.8 Hz, 2H), 8.13 (s, 2H), 8.11 (d, J=8.8 Hz, 2H), 7.66 (d, J=5.6 Hz, 2H), 7.56 (d, J=5.6 Hz, 2H), 4.35 (s, 6H)

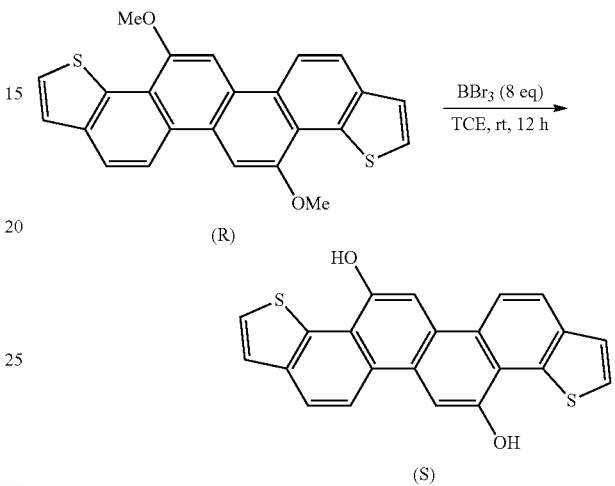

In an argon atmosphere, boron tribromide (a dichloromethane solution, 1.0 M) (25.4 mL, 25.4 mmol) was added to a 1,1,2,2-tetrachloroethane 50 mL solution of the compound (R) (1.27 g, 3.17 mmol), and the solution was stirred at room temperature for 12 hours. A small amount of methanol was added to this reaction solution, and the solvent was distilled under reduced pressure. The obtained solid was washed with methanol, thereby obtaining a compound (S) (1.19 g) which was a roughly purified substance in a yellow solid form. The compound was used in the following reaction as it was.

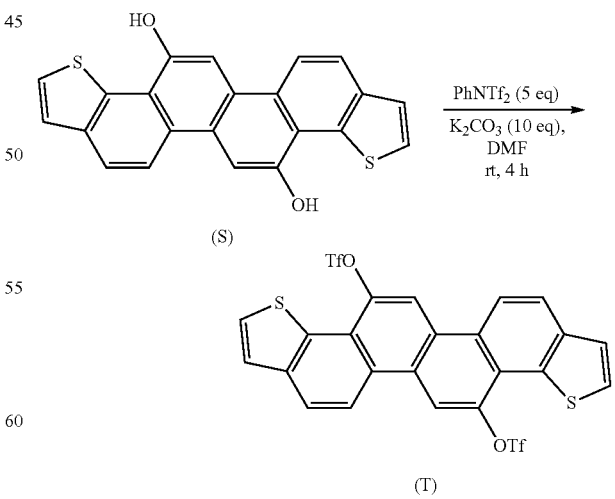

In an argon atmosphere, N,N-bis(trifluoromethylsulfonyl) aniline (5.71 g, 16.0 mmol) was added to a N,N-dimethylformamide 50 mL solution of the compound (S) (1.19 g, 3.19 mmol) and potassium carbonate (4.10 g, 31.9 mmol) at 0° C., and the solution was stirred at room temperature for four hours. Methanol was added to this reaction solution, the precipitate was filtered and washed with methanol, thereby obtaining a compound (T) (1.59 g, two-step yield: 79%) in a yellow solid form.

$^{1}$H NMR (400 MHz, C$_2$D$_2$Cl$_4$, ppm): δ 8.94 (s, 2H), 8.59 (d, J=8.8 Hz, 2H), 8.26 (d, J=8.8 Hz, 2H), 7.18 (d, J=5.6 Hz, 2H), 7.65 (d, J=5.6 Hz, 2H)

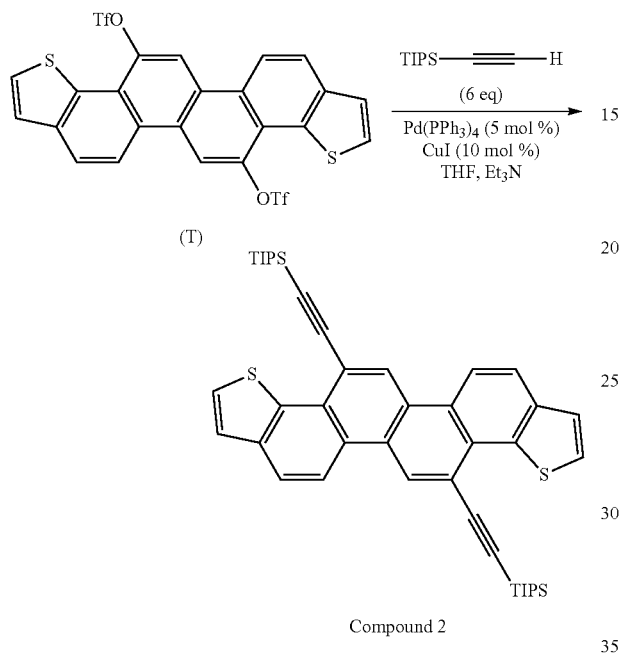

In an argon atmosphere, a solution mixture of triethylamine (3.0 mL) and tetrahydrofuran (6.0 mL) was added to the compound (T) (200 mg, 0.31 mmol), copper iodide (6.0 mg, 0.031 mmol), and tetrakis(triphenylphosphine) palladium (18 mg, 0.016 mmol). Next, triisopropylsilylacetylene (0.42 mL, 1.88 mmol) was added thereto, and the solution was heated and refluxed at 70° C. for four hours. Methanol was added to this reaction solution, and the precipitated solid was filtered. The obtained solid was purified by means of GPC, thereby obtaining the compound 2 (135 mg, yield: 61%) in a yellow solid form.

$^{1}$H NMR (400 MHz, CDCl$_3$, ppm): δ 9.12 (s, 2H), 8.74 (d, J=8.8 Hz, 2H), 8.14 (d, J=8.8 Hz, 2H), 7.56 (d, J=5.6 Hz, 2H), 7.65 (d, J=5.6 Hz, 2H), 1.42-1.26 (m, 21H)

<Synthesis of Compound 3>

A compound 3 which is the compound represented by General Formula (1) was synthesized according to a specific synthesis order illustrated in the following scheme.

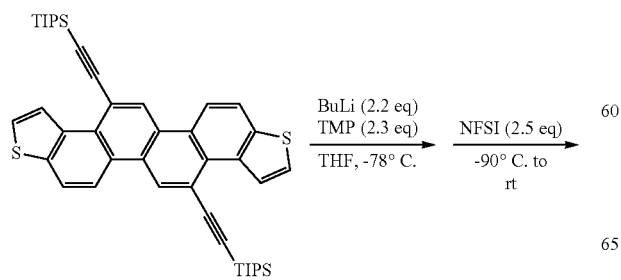

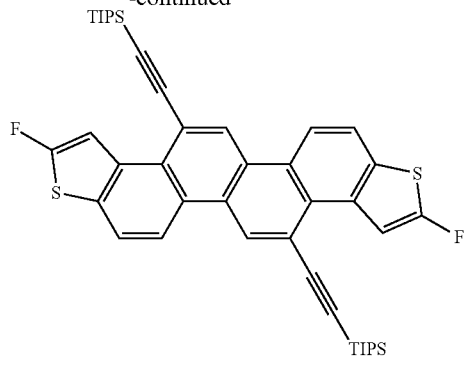
Compound 3

In an argon atmosphere, n-butyllithium (a hexane solution, 1.6 M) (274 μL, 0.44 mmol) was added dropwise to a tetrahydrofuran solution (130 μL) of 2,2,6,6-tetramethylpiperidine (77 μL, 0.46 mmol) at −78° C. and stirred for 30 minutes at 0° C. This solution mixture was added dropwise to a tetrahydrofuran 3 mL solution of the compound 1 (140 mg, 0.20 mmol) produced above at −78° C., and the solution was stirred for one hour. After that, a tetrahydrofuran 1.5 mL solution of N-fluorobenzenesulfoneimide (157 mg, 0.50 mmol) was added thereto at −90° C., and the solution was stirred for one hour. Methanol was added to this reaction solution, and the precipitated solid was filtered. The obtained solid was purified by means of silica gel column chromatography (hexane:toluene) and then GPC, thereby obtaining a compound 3 (45 mg, yield: 60%) in a yellow solid form.

$^{1}$H NMR (400 MHz, CDCl$_3$, ppm): δ 9.12 (d, J=4.0 Hz, 2H), 9.04 (s, 2H), 8.69 (d, J=5.2 Hz, 2H), 7.99 (d, J=5.2 Hz, 2H), 1.37-1.21 (m, 21H)

<Synthesis of Compound 4>

A compound 4 which is the compound represented by General Formula (2) was synthesized according to a specific synthesis order illustrated in the following scheme.

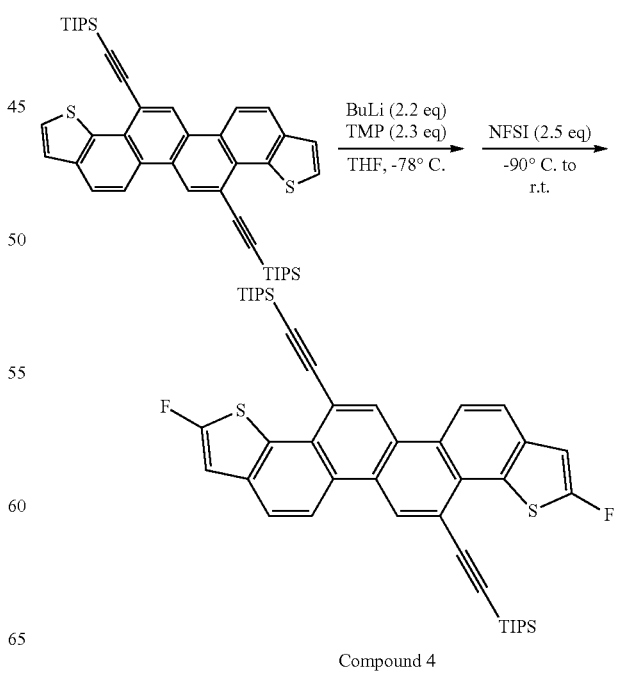
Compound 4

In an argon atmosphere, n-butyllithium (a hexane solution, 1.6 M) (490 μL, 0.78 mmol) was added dropwise to a tetrahydrofuran solution (350 μL) of 2,2,6,6-tetramethylpiperidine (138 μL, 0.82 mmol) at −78° C. and stirred for 30 minutes at 0° C. This solution mixture was added dropwise to a tetrahydrofuran 5 mL solution of the compound 2 (250 mg, 0.36 mmol) produced above at −78° C., and the solution was stirred for one hour. After that, a tetrahydrofuran 2.0 mL solution of N-fluorobenzenesulfoneimide (281 mg, 0.89 mmol) was added thereto at −90° C., and the solution was stirred for one hour. Methanol was added to this reaction solution, and the precipitated solid was filtered. The obtained solid was purified by means of silica gel column chromatography (hexane:toluene) and then GPC, thereby obtaining a compound 4 (100 mg, yield: 38%) in a yellow solid form.

$^1$H NMR (400 MHz, CDCl$_3$, ppm): δ 9.02 (s, 2H), 8.69 (d, J=5.2 Hz, 2H), 7.94 (d, J=5.2 Hz, 2H), 6.92 (d, J=2.4 Hz, 2H), 1.42-1.23 (m, 21H)

<Synthesis of Compound 5>

A compound 5 which is the compound represented by General Formula (1) was synthesized according to a specific synthesis order illustrated in the following scheme.

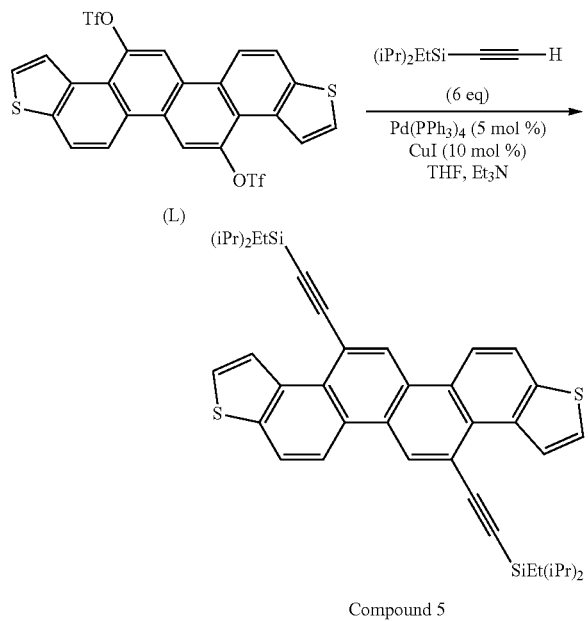

Compound 5

In an argon atmosphere, a solution mixture of triethylamine (3.0 mL) and tetrahydrofuran (6.0 mL) was added to the compound (L) (70 mg, 0.11 mmol), copper iodide (2.1 mg, 0.011 mmol), and tetrakis(triphenylphosphine) palladium (6.4 mg, 0.0055 mmol). Next, ethyldiisopropylsilylacetylene (111 mg, 0.66 mmol) was added thereto, and the solution was heated and refluxed at 70° C. for four hours. Methanol was added to this reaction solution, and the precipitated solid was filtered. The obtained solid was purified by means of GPC, thereby obtaining the compound 5 (32 mg, yield: 43%) in a yellow solid form.

<Synthesis of Compound 6>

A compound 6 which is the compound represented by General Formula (1) was synthesized according to a specific synthesis order illustrated in the following scheme.

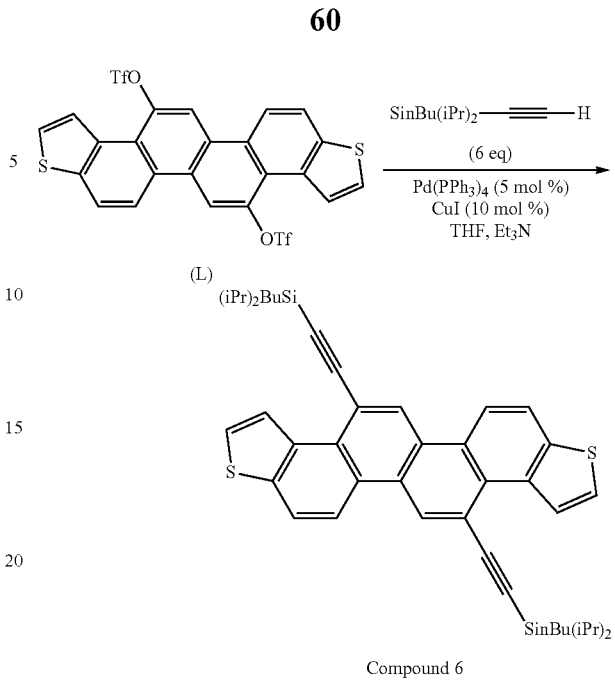

Compound 6

In an argon atmosphere, a solution mixture of triethylamine (0.3 mL) and tetrahydrofuran (0.6 mL) was added to the compound (L) (56.3 mg, 0.088 mmol), copper iodide (1.7 mg, 0.0088 mmol), and tetrakis(triphenylphosphine) palladium (5.1 mg, 0.0044 mmol). Next, butyldiisopropylsilylacetylene (104 mg, 0.66 mmol) was added thereto, and the solution was heated and refluxed at 70° C. for four hours. Methanol was added to this reaction solution, and the precipitated solid was filtered. The obtained solid was purified by means of GPC, thereby obtaining the compound 6 (35.0 mg, yield: 54%) in a yellow solid form.

<Syntheses of Comparative Compounds 1 to 3>

Comparative compounds 1 to 3 used for organic semiconductor films (organic semiconductor layers) in comparative elements were synthesized according to the synthesis method described in JP2014-078729A. The structures of the comparative compounds 1 to 3 will be illustrated below.

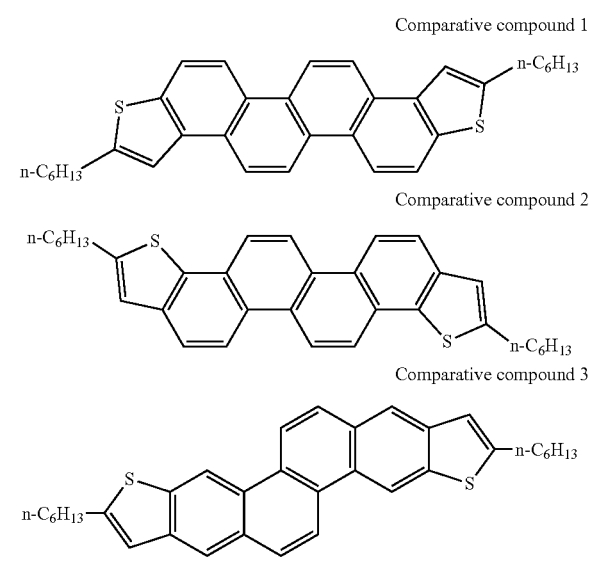

<<Production and Evaluation of Elements>>

For the materials for an organic thin-film transistor used to produce elements (the respective compounds described above), the purities (the absorption intensity area ratio at 254 nm) were confirmed to be 99.0% or higher by means of high-speed liquid chromatography (TSKgel ODS-100Z manufactured by Tosoh Corporation).

<Production of Bottom Gate-Top Contact-Type Element by Coating Process>

The compound 1 synthesized above and anisole as a solvent were mixed together so as to prepare 0.1% by mass of a solution at room temperature, and the solution was considered as a composition for an organic thin-film transistor 1.

In addition, compositions for an organic thin-film transistor 2 to 6 and compositions for an organic thin-film transistor for comparison 1 to 3 were respectively prepared using the same method except for the fact that any one of the compounds 2 to 6 or the comparative compounds 1, 2, or 3 was used instead of the compound 1. Here, the solubility of the comparative compounds 1 to 3 was low, 0.1% by mass of the solution was heated to 80° C. using anisole as a solvent, thereby producing the compositions for an organic thin-film transistor.

Figure 3:
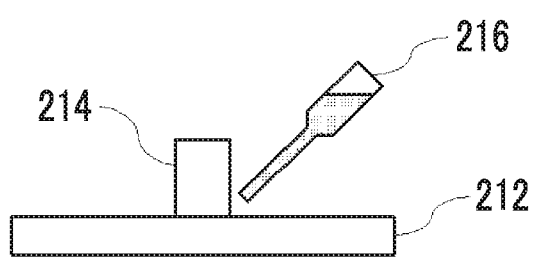
FIG. 3 is a schematic view illustrating a step of a method for manufacturing an organic semiconductor film in examples and comparative examples.
Figure 4A:
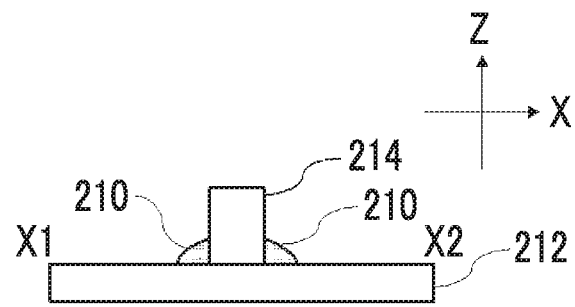
FIG. 4A is a schematic view illustrating a step of the method for manufacturing an organic semiconductor film in the examples and the comparative examples.
Figure 4B:
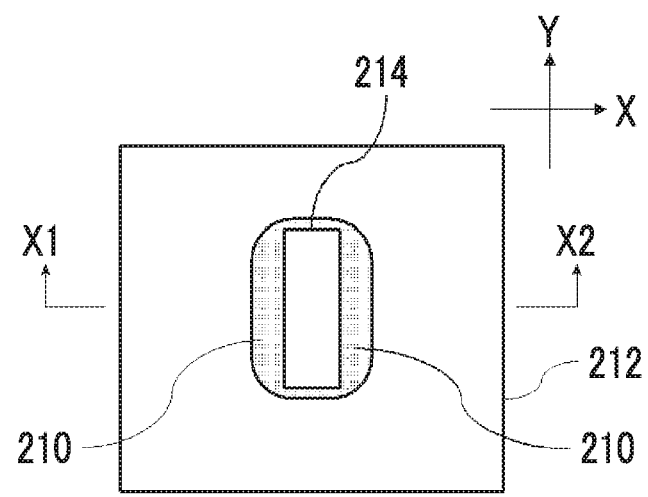
FIG. 4B is a schematic view illustrating a step of the method for manufacturing an organic semiconductor film in the examples and the comparative examples.
Figure 5:
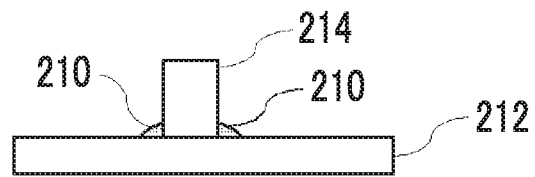
FIG. 5 is a schematic view illustrating a step of the method for manufacturing an organic semiconductor film in the examples and the comparative examples.

In the example and the comparative examples, organic semiconductor films were formed using the method illustrated in FIG. 3 to FIG. 5. FIG. 3 to FIG. 5 are schematic views illustrating a method for manufacturing the organic semiconductor films of the examples and the comparative examples.

The method for forming the organic semiconductor film will be described in detail using a case in which the composition for an organic thin-film transistor 1 was used as an example.

A 10 mm×10 mm substrate obtained by forming a 500 nm-thick $SiO_2$ thermally oxidized film on the surface of an n-type silicon substrate (thickness: 0.4 mm) was used as a substrate 212. The thermally oxidized film-side surface of the substrate 212 was washed with ultraviolet (UV)-ozone and then subjected to a β-phenethyltrimethoxysilane treatment.

On the β-phenethyltrimethoxysilane-treated surface of the substrate 212, a member 214 was placed in the central portion of the substrate 212 as illustrated in FIG. 3 so as to come into contact with the substrate 212. As the member 214, a glass member having a length of 6 mm, a width of 1 mm, and a height of 2 mm was used. The horizontal direction (X-axis direction) in FIG. 3 is the width direction of the member 214, the vertical direction (Z-axis direction) in FIG. 3 is the height direction of the member 214, and the vertical direction (Y-axis direction) in FIG. 4B is the length direction of the member 214.

The substrate 212 was heated to 40° C., and one droplet (approximately 0.03 ml) of the composition for an organic thin-film transistor 1 (a composition for an organic thin-film transistor 210 illustrated in FIGS. 3 to 5) prepared using the above-described method was dropped on the substrate using a pipette 216 through a side portion of the member 214 so as to come into contact with both the substrate 212 and the member 214 as illustrated in FIG. 3, thereby adding the composition for an organic thin-film transistor 1 dropwise to a portion on the surface of the substrate 212 as illustrated in FIG. 4A and FIG. 4B. A concave meniscus was formed in the interface with the member 214.

The dropwise-added composition for an organic thin-film transistor 1 was naturally dried in a state in which the substrate 212 and the member 214 were in contact with each other and the positional relationship between the substrate 212 and the member 214 was fixed as illustrated in FIG. 5. After that, the composition was dried at a reduced pressure of $10^{-3}$ MPa and 40° C. for eight hours so as to precipitate the crystals of Compound 1, thereby forming an organic semiconductor film. Whether or not crystals were precipitated was checked by means of observation using a polarization microscope. Meanwhile, the film thickness of the obtained organic semiconductor film was 70 nm.

Furthermore, a mask was worn on the obtained organic semiconductor film, and a 2 nm-thick 2,3,5,6-tetrafluoro-7,7,8,8-tetracyanoquinodimethan (F4-TCNQ) as a charge injection acceptor and a 40 nm-thick metal electrode were respectively deposited thereon, thereby obtaining an organic thin-film transistor element 1 for measuring field-effect transistor (FET) characteristics (hereinafter, also referred to as "element 1").

In addition, organic thin-film transistor elements 2 to 6 (hereinafter, also referred to as "elements 2 to 6") and comparative organic thin-film transistor elements 1 to 3 (hereinafter, also referred to as "comparative elements 1 to 3") were respectively produced according to the method for producing the element 1 except for the fact that any one of the compositions for an organic thin-film transistor 2 to 6 and the compositions for an organic thin-film transistor for comparison 1, 2, and 3 was used instead of the composition for an organic thin-film transistor 1. The obtained elements 1 to 6 and the comparative elements 1 to 3 were considered as organic thin-film transistors of Examples 1 to 6 and Comparative Examples 1 to 3.

<Evaluation>

(Carrier Mobility)

The FET characteristics of each of the organic thin-film transistor elements (the elements 1 to 6 and the comparative elements 1 to 3) were evaluated from the viewpoint of carrier mobility at normal pressure in the atmosphere using a semiconductor parameter analyzer (manufactured by Agilent, 4156C) to which a semi-auto prober (manufactured by Vector Semiconductor Co., Ltd., AX-2000) was connected.

A voltage of −50 V was applied between a source electrode and a drain electrode in each of the organic thin-film transistor element (FET element), the gate voltage was changed in a range of 20 V to −150 V, and the carrier mobility μ was computed using an expression expressing the drain current $I_d=(w/2L)\mu C_i(V_g-V_{th})^2$ (in the expression, L represents the gate length, W represents the gate width, $C_i$ represents the capacity of an insulating layer per unit area, $V_g$ represents the gate voltage, and $V_{th}$ represents the threshold voltage) and evaluated using the following four levels.

The obtained results are shown in the following table.

"A": ≥0.5 cm$^2$/Vs

"B": 0.1 cm$^2$/Vs or more to less than 0.5 cm$^2$//Vs

"C": 0.05 cm$^2$/Vs or more to less than 0.1 cm$^2$//Vs

"D": <0.05 cm$^2$/Vs (Solubility)

The compound of the present invention or each of the comparative compounds (5 mg) and any one of a variety of solvents shown below (1 mL) were mixed together, and the solubility was evaluated to the following two levels. The obtained results are shown in the following table.

"A": Fully dissolved.

"B": Not fully dissolved.

TABLE 2

| | Element No. | Material for organic thin-film transistor | Carrier mobility (cm²/Vs) | Solubility | | | | |
|---|---|---|---|---|---|---|---|---|
| | | | | Toluene | Anisole | Tetralin | Tetrahydrofuran | Chloroform |
| Example 1 | Element 1 | Compound 1 | A | A | A | A | A | A |
| Example 2 | Element 2 | Compound 2 | A | A | A | A | A | A |
| Example 3 | Element 3 | Compound 3 | A | A | A | A | A | A |
| Example 4 | Element 4 | Compound 4 | A | A | A | A | A | A |
| Example 5 | Element 5 | Compound 5 | B | A | A | A | A | A |
| Example 6 | Element 6 | Compound 6 | B | A | A | A | A | A |
| Comparative Example 1 | Comparative element 1 | Comparative compound 1 | C | B | B | B | B | B |
| Comparative Example 2 | Comparative element 2 | Comparative compound 2 | C | B | B | B | B | B |
| Comparative Example 3 | Comparative element 3 | Comparative compound 3 | D | B | B | B | B | B |

Examples 7 to 12 and Comparative Examples 4 to 6

<<Production and Evaluation of Elements>>

<Production of Bottom Gate-Bottom Contact-Type Element by Deposition Process>

In Examples 7 to 12 and Comparative Examples 4 to 6, bottom gate-bottom contact-type organic thin-film transistor elements were produced. The details will be described below.

The composition for an organic thin-film transistor 1 obtained by adjusting the anisole solution of 0.1% by mass of the compound 1 at room temperature in Example 1 was cast (using a drop casting method) onto a substrate for measuring FET characteristics at room temperature, which will be described below, in a nitrogen atmosphere, thereby obtaining a non-luminous organic thin-film transistor element 7 (hereinafter, also referred to as "element 7").

As the substrate for measuring FET characteristics, a bottom gate and top contact-structured silicon substrate including chromium/gold disposed in a comb shape (gate width W: 100 mm, gate length L: 100 µm) as source and drain electrodes and $SiO_2$ (film thickness: 500 nm) as an insulating film was used.

Organic thin-film transistor elements 8 to 12 (hereinafter, also referred to as "elements 8 to 12") and comparative organic thin-film transistor elements 4 to 6 (hereinafter, also referred to as "comparative elements 4 to 6") were respectively produced according to the method for producing the element 7 except for the fact that the compositions for an organic thin-film transistor 2 to 6 and the compositions for an organic thin-film transistor for comparison 1, 2, and 3 was used instead of the composition for an organic thin-film transistor 1. Here, the solubility of the comparative compounds 1 to 3 was low, 0.1% by mass of the solution was heated to 80° C. using anisole as a solvent, thereby producing the compositions for an organic thin-film transistor. The obtained elements 7 to 12 and the comparative elements 4 to 6 were considered as organic thin-film transistors of Examples 7 to 12 and Comparative Examples 4 to 6.

<Evaluation>

The FET characteristics of each of the organic thin-film transistor elements (the elements 7 to 12 and the comparative elements 4 to 6) were evaluated using the same method as in Example 1. The results are shown in the following table.

TABLE 3

| | Element No. | Material for organic thin-film transistor | Carrier mobility (cm²/Vs) |
|---|---|---|---|
| Example 7 | Element 7 | Compound 1 | A |
| Example 8 | Element 8 | Compound 2 | A |
| Example 9 | Element 9 | Compound 3 | A |
| Example 10 | Element 10 | Compound 4 | A |
| Example 11 | Element 11 | Compound 5 | B |
| Example 12 | Element 12 | Compound 6 | B |
| Comparative Example 4 | Comparative element 4 | Comparative compound 1 | D |
| Comparative Example 5 | Comparative element 5 | Comparative compound 2 | D |
| Comparative Example 6 | Comparative element 6 | Comparative compound 3 | D |

The above-shown evaluation results show that the compound represented by General Formula (1) or General Formula (2) had a favorable solubility, and all of the organic thin-film transistors of the respective examples (Examples 1 to 12) for which the compound was used had a high carrier mobility.

Meanwhile, it was clarified that, in all of the organic thin-film transistor elements in which the comparative compounds 1 to 3 that are not in the scope of General Formulae (1) and (2) were used for the organic semiconductor layers as the material for an organic thin-film transistor (Comparative Examples 1 to 6), the carrier mobility was low.

Examples 13 to 18 and Comparative Examples 7 to 9

<Production of Bottom Gate-Bottom Contact-Type Element Using Polymer Binder>

Bottom gate-bottom contact-type elements 13 were produced in the same manner as in Example 7 except for the fact that a material containing the compound 1 and poly α-methylstyrene in a mass ratio of 1:1 (material 1') was used instead of the compound 1 in Example 7. The obtained element 13 was considered as an organic thin-film transistor element of Example 13.

Organic thin-film transistor elements 14 to 18 (hereinafter, also referred to as "elements 14 to 18") and comparative organic thin-film transistor elements 7 to 9 (hereinafter, also referred to as "comparative elements 7 to 9") were respectively produced using the same method except for the fact that, in the production of the elements 13, any one of the compounds 2 to 6 and the comparative compounds 1, 2, and 3 was used instead of the compound 1. The obtained elements 14 to 18 and the comparative elements 7 to 9 were considered as organic thin-film transistors of Examples 14 to 18 and Comparative Examples 7 to 9.

<Evaluation>

The FET characteristics of each of the organic thin-film transistor elements (the elements 13 to 18 and the comparative elements 7 to 9) were evaluated using the same method as in Example 1. The results are shown in the following table.

TABLE 4

| | Element No. | Material for organic thin-film transistor | Carrier mobility ($cm^2/Vs$) |
|---|---|---|---|
| Example 13 | Element 13 | Material 1' | A |
| Example 14 | Element 14 | Material 2' | A |
| Example 15 | Element 15 | Material 3' | A |
| Example 16 | Element 16 | Material 4' | A |
| Example 17 | Element 17 | Material 5' | B |
| Example 18 | Element 18 | Material 6' | B |
| Comparative Example 7 | Comparative element 7 | Comparative material 1' | D |
| Comparative Example 8 | Comparative element 8 | Comparative material 2' | D |
| Comparative Example 9 | Comparative element 9 | Comparative material 3' | D |

From the table, it was confirmed that, in the organic thin-film transistor elements of the respective examples for which the compound represented by General Formula (1) or General Formula (2) of the present invention was used, the carrier mobility was high even in the case of the bottom gate-bottom contact-type elements and the case of using the polymer binders, and it was found that the compound represented by General Formula (1) or General Formula (2) can be preferably used as materials for an organic thin-film transistor.

Meanwhile, it was found that the organic thin-film transistor elements in which the comparative compounds 1 to 3 that are not in the scope of General Formula (1) were used for the organic semiconductor layers as the organic thin-film transistor material, the carrier mobility was low.

Examples 19 to 30

<<Production and Evaluation of Elements>>
<Production of Bottom Gate-Bottom Contact-Type Element by Printing Method>
—Ink Jet Method—

The compound 1 and tetralin as a solvent were mixed together so as to prepare 0.1% by mass of a solution, and the solution was considered as a composition for an organic thin-film transistor 21. In addition, compositions for an organic thin-film transistor 22 to 26 were prepared in the same manner except for the fact that the respective compounds 2 to 6 were used instead of the compound 1.

An organic semiconductor film was formed on the same bottom gate-bottom contact-type substrate for measuring FET characteristics as in Example 7 using the composition for an organic thin-film transistor 21 and an ink jet method, thereby obtaining a non-luminous organic thin-film transistor element 19 (hereinafter, also referred to as "element 19").

Meanwhile, the specific method for producing the organic semiconductor film using the ink jet method is as described below.

As an ink jet apparatus, a 10 pl head of DMP2831 (manufactured by Fuji Graphic Systems) was used, and a beta film was formed at a jetting frequency of 2 Hz and an inter-dot pitch of 20 μm. After that, the beta film was dried at 70° C. for one hour, thereby forming an organic semiconductor film.

Organic thin-film transistor elements 20 to 24 (hereinafter, also referred to as "elements 20 to 24") were respectively produced according to the method for producing the element 19 except for the fact that the compositions for an organic thin-film transistor 22 to 26 were used instead of the composition for an organic thin-film transistor 21. The obtained elements 19 to 24 were considered as organic thin-film transistors of Examples 19 to 24.

—Flexo Printing Method—

An application liquid for an organic semiconductor device was prepared by dissolving the compound 1 (0.5% by mass), poly α-methylstyrene (0.5% by mass), and BYK323 (manufactured by BYK) (0.05% by mass) as a surfactant in tetralin and was used as a composition for an organic thin-film transistor 31. In addition, compositions for an organic thin-film transistor 32 to 36 were prepared in the same manner except for the fact that the respective compounds 2 and 6 were used instead of the compound 1.

An organic semiconductor film was formed on the same bottom gate-bottom contact-type substrate for measuring FET characteristics as in Example 7 using the composition for an organic thin-film transistor 31 and a flexo printing method, thereby obtaining a non-luminous organic thin-film transistor element 25 (hereinafter, also referred to as "element 25").

Meanwhile, the specific method for producing the organic semiconductor film using the flexo printing method is as described below.

As a printing apparatus, a flexo suitability tester F1 (manufactured by IGT Testing Systems K.K.) was used, and, as a flexo resin plate, an AFP DSH 1.70% (manufactured by Asahi Kasei Corporation)/a solid image was used. Printing was carried out at a pressure between the plate and the substrate of 60 N and a transportation rate of 0.4 in/second, and then the printed film was dried at 60° C. for two hours, thereby producing an organic semiconductor film (film thickness: 50 nm).

Organic thin-film transistor elements 26 to 30 (hereinafter, also referred to as "elements 26 to 30") were respectively produced according to the method for producing the element 25 except for the fact that the compositions for an organic thin-film transistor 32 to 36 were used instead of the composition for an organic thin-film transistor 31. The obtained elements 25 to 30 were considered as organic thin-film transistors of Examples 25 to 30.

<Evaluation>

The FET characteristics of each of the organic thin-film transistor elements (the elements 19 to 30) were evaluated using the same method as in Example 1. The results are shown in the following table.

TABLE 5

| | Element No. | Material for organic thin-film transistor | Carrier mobility ($cm^2/Vs$) |
|---|---|---|---|
| Example 19 | Element 19 | Compound 1 | A |
| Example 20 | Element 20 | Compound 2 | A |
| Example 21 | Element 21 | Compound 3 | A |
| Example 22 | Element 22 | Compound 4 | A |
| Example 23 | Element 23 | Compound 5 | B |
| Example 24 | Element 24 | Compound 6 | B |
| Example 25 | Element 25 | Compound 1 | A |
| Example 26 | Element 26 | Compound 2 | A |
| Example 27 | Element 27 | Compound 3 | A |

TABLE 5-continued

| | Element No. | Material for organic thin-film transistor | Carrier mobility (cm$^2$/Vs) |
|---|---|---|---|
| Example 28 | Element 28 | Compound 4 | A |
| Example 29 | Element 29 | Compound 5 | B |
| Example 30 | Element 30 | Compound 6 | B |

From Table 5, it was confirmed that, in all of the organic thin-film transistor elements of the respective examples including the organic semiconductor layers obtained by forming a film of the compound represented by General Formula (1) or General Formula (2) of the present invention using the ink jet method or the flexo printing method, the carrier mobility was high. From this result, it is found that the compound represented by General Formula (1) or General Formula (2) of the present invention can be preferably used as organic thin-film transistor materials.

Examples 31 to 36

<Production of Bottom Gate-Top Contact-Type Element by Deposition Process>

The oxidized film-side surface of the substrate 212 was washed with UV-ozone using the same method as in Example 1 and then subjected to a dodecyltrichlorosilane treatment.

On the dodecyltrichlorosilane-treated surface of the substrate 212, a film of the compound 1 was deposited and grown at a deposition rate of 0.05 nm/s so as to obtain a film thickness of 40 nm.

Furthermore, a mask was worn on the obtained organic semiconductor film, and a 2 nm-thick F4-TCNQ as a charge injection acceptor and a 40 nm-thick metal electrode were respectively deposited thereon, thereby obtaining an organic thin-film transistor element 31 for measuring FET characteristics (hereinafter, also referred to as "element 31"). The obtained organic thin-film transistor element 31 was considered as an organic thin-film transistor element of Example 31.

Organic thin-film transistor elements 32 to 36 (hereinafter, also referred to as "elements 32 to 36") were respectively produced using the same method as for the element 31 except for the fact that any one of the compounds 2 to 6 was used instead of the compound 1. The obtained elements 32 to 36 were considered as organic thin-film transistors of Examples 32 to 36.

<Evaluation>

The FET characteristics of each of the organic thin-film transistor elements (the elements 31 to 36) were evaluated using the same method as in Example 1. The results are shown in the following table.

TABLE 6

| | Element No. | Material for organic thin-film transistor | Carrier mobility (cm$^2$/Vs) |
|---|---|---|---|
| Example 31 | Element 31 | Compound 1 | A |
| Example 32 | Element 32 | Compound 2 | A |
| Example 33 | Element 33 | Compound 3 | A |
| Example 34 | Element 34 | Compound 4 | A |
| Example 35 | Element 35 | Compound 5 | B |
| Example 36 | Element 36 | Compound 6 | B |

From Table 6, it was confirmed that, in all of the organic thin-film transistor elements of the respective examples including the organic semiconductor layers obtained by forming a film of the compound represented by General Formula (1) or General Formula (2) of the present invention using a vacuum deposition method, the carrier mobility was high. From this result, it was found that the compound represented by General Formula (1) or General Formula (2) of the present invention can be preferably used as organic thin-film transistor materials.

Examples 37 to 42

<Production of Inverter>

Figure 6:
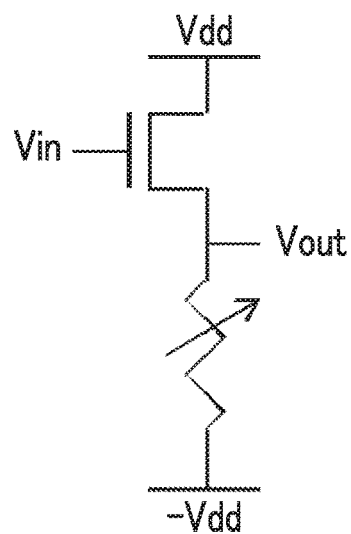
FIG. 6 is a schematic view of an inverter produced in the examples.

A variable resistance was connected to the organic thin-film transistor element of Example 1 as illustrated in FIG. 6, and the resistance value of the variable resistance was set to an appropriate value, thereby producing an inverter element 37. In addition, inverter elements 38 to 42 were produced using the organic thin-film transistor elements of Example 2 to Example 6 instead of the organic thin-film transistor element of Example 1. All of the inverter elements exhibited favorable inverter characteristics of 10 or higher gains.

Examples 43 to 48

<Production of Ring Oscillator>

Figure 7:
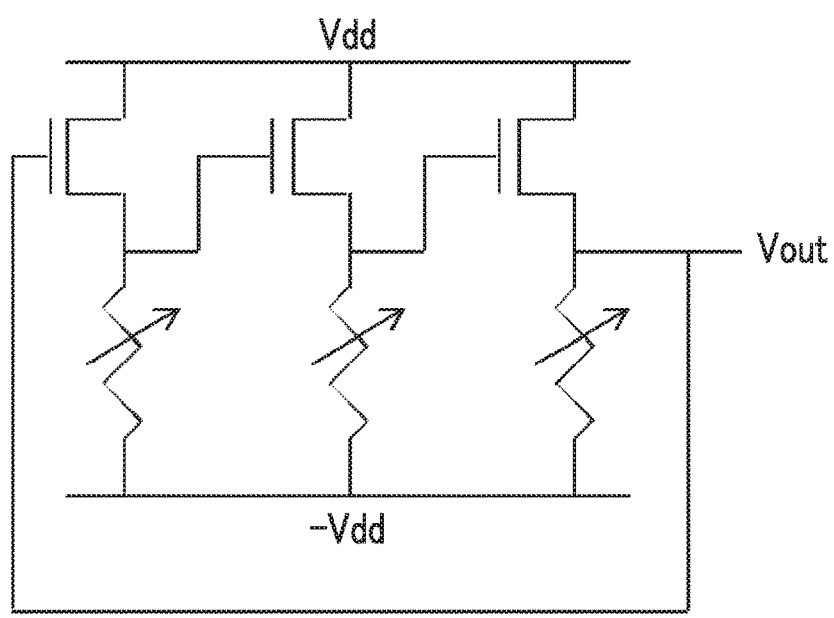
FIG. 7 is a schematic view of a ring oscillator produced in the examples.

The inverter elements of Example 37 were linked in three levels as illustrated in FIG. 7, thereby producing a ring oscillator element 43. In addition, ring oscillator elements 44 to 48 were produced using the inverter elements of Example 38 to Example 42 instead of the inverter of Example 37. All of the ring oscillator elements stably generated oscillations.

As described above, it has been shown that a variety of kinds of devices can be produced using the compound of the present invention.

EXPLANATION OF REFERENCES

10: substrate, 20: gate electrode, 30: gate insulating film, 40: source electrode, 42: drain electrode, 50: organic semiconductor film (organic semiconductor layer), 60: sealing layer, 100, 200: organic thin-film transistor, 210: composition for organic thin-film transistor, 212: substrate, 214: member, 216: pipette

What is claimed is:

1. An organic thin-film transistor comprising:
   an organic semiconductor film including a compound that is represented by General Formula (1) or General Formula (2) and has a molecular weight of 3,000 or less, General Formula (1)

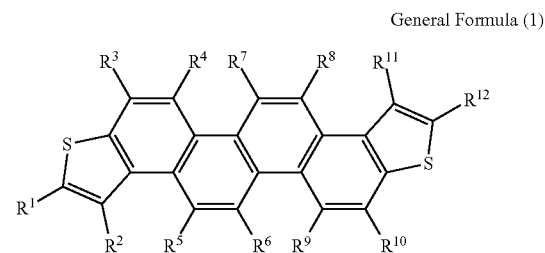

-continued

General Formula (2)

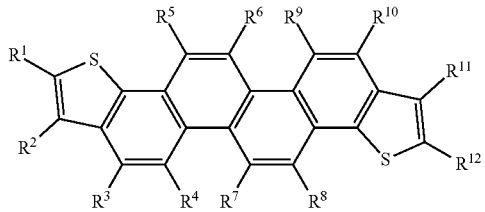

in General Formula (1) and General Formula (2), $R^1$ to $R^{12}$ each independently represent a group represented by Formula (W),

-L$^W$-R$^W$            (W)

in Formula (W), L$^W$ is a divalent linking group of any of a single bond, —O—, —S—, —NR$^{13}$—, —CO—, —SO—, —SO$_2$—, or —Si(R$^{14}$)(R$^{15}$) or a divalent linking group obtained by bonding two or more divalent linking groups described above, R$^W$ represents a hydrogen atom, a halogen atom, or an alkyl group, an alkenyl group, an alkynyl group, an aryl group, or a heteroaryl group, all of which may have a substituent, $R^{13}$ to $R^{15}$ each independently represent a hydrogen atom or an alkyl group, an alkenyl group, an alkynyl group, an aryl group, or a heteroaryl group, all of which may have a substituent, and here, in General Formula (1) and General Formula (2), at least one of $R^5$ to $R^8$ is a group other than a hydrogen atom.

2. The organic thin-film transistor according to claim 1, wherein, in General Formula (1) and General Formula (2), the number of carbon atoms included in each of $R^1$ to $R^{12}$ is independently 30 or less.

3. The organic thin-film transistor according to claim 2, wherein, in General Formula (1) and General Formula (2), at least one of $R^1$ to $R^{12}$ has, as R$^W$, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms.

4. The organic thin-film transistor according to claim 2, wherein, in General Formula (1) and General Formula (2), $R^1$ and $R^{12}$ are the same group, $R^2$ and $R^{11}$ are the same group, $R^3$ and $R^{10}$ are the same group, $R^4$ and $R^9$ are the same group, $R^5$ and $R^8$ are the same group, and $R^6$ and $R^7$ are the same group.

5. The organic thin-film transistor according to claim 2, wherein the compound is represented by General Formula (3) or General Formula (4) and has a molecular weight of 3,000 or less, General Formula (3)

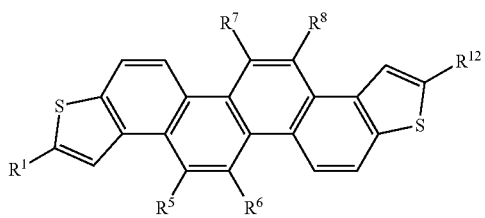

-continued

General Formula (4)

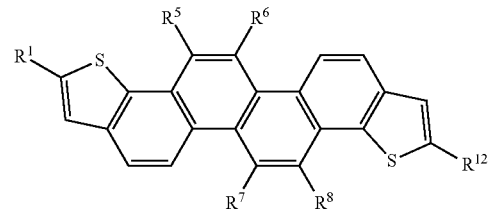

in General Formulae (3) and (4), $R^1$, $R^5$ to $R^8$, and $R^{12}$ each independently represent a group represented by Formula (W),

-L$^W$-R$^W$            (W)

in Formula (W), L$^W$ is a divalent linking group of any of a single bond, —O—, —S—, —NR$^{13}$—, —CO—, —SO—, —SO$_2$—, or —Si(R$^{14}$)(R$^{15}$) or a divalent linking group obtained by bonding two or more divalent linking groups described above, R$^W$ represents a hydrogen atom, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms, $R^{13}$ to $R^{15}$ each independently represent a hydrogen atom or an alkyl group, an alkenyl group, an alkynyl group, an aryl group, or a heteroaryl group, all of which may have a substituent, here, $R^1$ and $R^{12}$ are the same group, $R^5$ and $R^8$ are the same group, and $R^6$ and $R^7$ are the same group, and any one combination of $R^5$ and $R^8$, and $R^6$ and $R^7$ is a group other than a hydrogen atom.

6. The organic thin-film transistor according to claim 1, wherein, in General Formula (1) and General Formula (2), at least one of $R^1$ to $R^{12}$ has, as R$^W$, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms.

7. The organic thin-film transistor according to claim 6, wherein, in General Formula (1) and General Formula (2), $R^1$ and $R^{12}$ are the same group, $R^2$ and $R^{11}$ are the same group, $R^3$ and $R^{10}$ are the same group, $R^4$ and $R^9$ are the same group, $R^5$ and $R^8$ are the same group, and $R^6$ and $R^7$ are the same group.

8. The organic thin-film transistor according to claim 1, wherein, in General Formula (1) and General Formula (2), $R^1$ and $R^{12}$ are the same group, $R^2$ and $R^{11}$ are the same group, $R^3$ and $R^{10}$ are the same group, $R^4$ and $R^9$ are the same group, $R^5$ and $R^8$ are the same group, and $R^6$ and $R^7$ are the same group.

9. The organic thin-film transistor according to claim 1, wherein the compound is represented by General Formula (3) or General Formula (4) and has a molecular weight of 3,000 or less, General Formula (3)

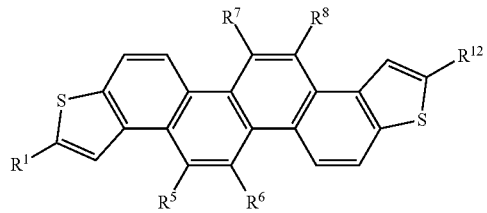

General Formula (4)

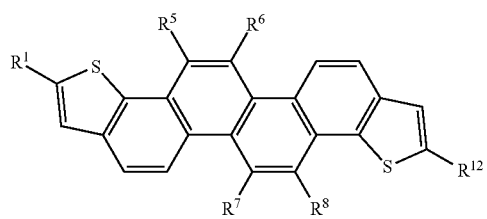

in General Formulae (3) and (4), $R^1$, $R^5$ to $R^8$, and $R^{12}$ each independently represent a group represented by Formula (W), $$-L^W\text{-}R^W \qquad (W)$$

in Formula (W), $L^W$ is a divalent linking group of any of a single bond, —O—, —S—, —NR$^{13}$—, —CO—, —SO—, —SO$_2$—, or —Si(R$^{14}$)(R$^{15}$) or a divalent linking group obtained by bonding two or more divalent linking groups described above, $R^W$ represents a hydrogen atom, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms, $R^{13}$ to $R^{15}$ each independently represent a hydrogen atom or an alkyl group, an alkenyl group, an alkynyl group, an aryl group, or a heteroaryl group, all of which may have a substituent, here, $R^1$ and $R^{12}$ are the same group, $R^5$ and $R^8$ are the same group, and $R^6$ and $R^7$ are the same group, and any one combination of $R^5$ and $R^8$, and $R^6$ and $R^7$ is a group other than a hydrogen atom.

10. The organic thin-film transistor according to claim 1, wherein the compound is represented by General Formula (5) or General Formula (6) and has a molecular weight of 3,000 or less, General Formula (5)

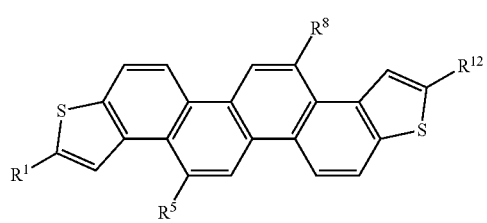

General Formula (6)

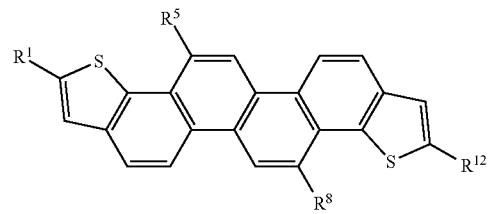

in General Formulae (5) and (6), $R^1$, $R^5$, $R^8$, and $R^{12}$ each independently represent a group represented by Formula (W), $$-L^W\text{-}R^W \qquad (W)$$

in Formula (W), $L^W$ is a divalent linking group of any of a single bond, —O—, —S—, —NR$^{13}$—, —CO—, —SO—, —SO$_2$—, or —Si(R$^{14}$)(R$^{15}$) or a divalent linking group obtained by bonding two or more divalent linking groups described above, $R^W$ represents a hydrogen atom, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms, $R^{13}$ to $R^{15}$ each independently represent a hydrogen atom or an alkyl group, an alkenyl group, an alkynyl group, an aryl group, or a heteroaryl group, all of which may have a substituent, here, $R^1$ and $R^{12}$ are the same group, $R^5$ and $R^8$ are the same group, and the combination of $R^5$ and $R^8$ is a group other than a hydrogen atom.

11. A compound which is represented by General Formula (1) or General Formula (2) and has a molecular weight of 3,000 or less, General Formula (1)

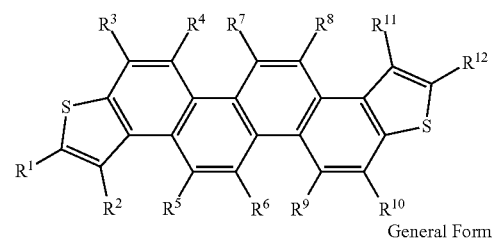

General Formula (2)

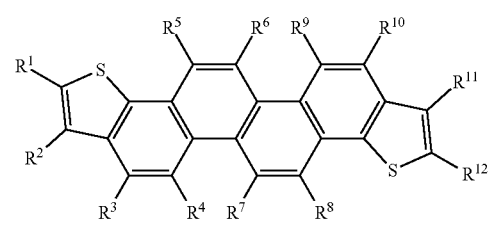

in General Formula (1) and General Formula (2), $R^1$ to $R^{12}$ each independently represent a group represented by Formula (W), $$-L^W\text{-}R^W \qquad (W)$$

in Formula (W), $L^W$ is a divalent linking group of any of a single bond, —O—, —S—, —NR$^{13}$—, —CO—, —SO—, —SO$_2$—, or —Si(R$^{14}$)(R$^{15}$) or a divalent linking group obtained by bonding two or more divalent linking groups described above, $R^W$ represents a hydrogen atom, a halogen atom, or an alkyl group, an alkenyl group, an alkynyl group, an aryl group, or a heteroaryl group, all of which may have a substituent, $R^{13}$ to $R^{15}$ each independently represent a hydrogen atom or an alkyl group, an alkenyl group, an alkynyl group, an aryl group, or a heteroaryl group, all of which may have a substituent, and here, in General Formula (1) and General Formula (2), at least one of $R^5$ to $R^8$ is a group other than a hydrogen atom.

12. The compound according to claim 11, wherein, in General Formula (1) and General Formula (2), the number of carbon atoms included in each of $R^1$ to $R^{12}$ is independently 30 or less.

13. The compound according to claim 11, wherein, in General Formula (1) and General Formula (2), at least one of $R^1$ to $R^{12}$ has, as $R^W$, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms.

14. The compound according to claim 11, wherein, in General Formula (1) and General Formula (2), $R^1$ and $R^{12}$ are the same group, $R^2$ and $R^{11}$ are the same group, $R^3$ and $R^{10}$ are the same group, $R^4$ and $R^9$ are the same group, $R^5$ and $R^8$ are the same group, and $R^6$ and $R^7$ are the same group.

15. The compound according to claim 11, wherein the compound is represented by General Formula (3) or General Formula (4) and has a molecular weight of 3,000 or less,

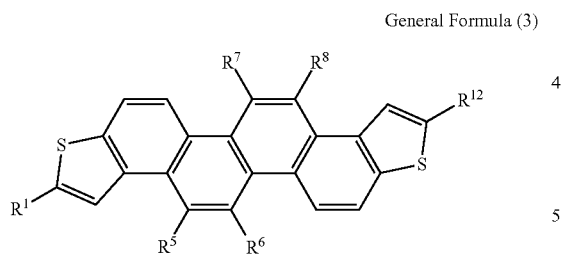

General Formula (3)

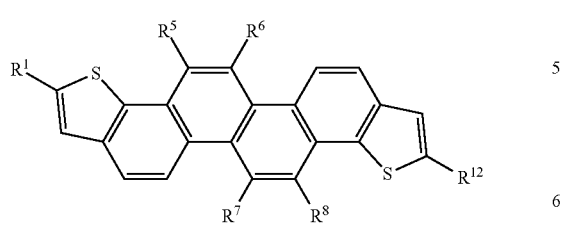

General Formula (4)

in General Formulae (3) and (4), $R^1$, $R^5$ to $R^8$, and $R^{12}$ each independently represent a group represented by Formula (W),

-L$^W$-R$^W$ (W)

in Formula (W), $L^W$ is a divalent linking group of any of a single bond, —O—, —S—, —NR$^{13}$—, —CO—, —SO—, —SO$_2$—, or —Si(R$^{14}$)(R$^{15}$) or a divalent linking group obtained by bonding two or more divalent linking groups described above, $R^W$ represents a hydrogen atom, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms, $R^{13}$ to $R^{15}$ each independently represent a hydrogen atom or an alkyl group, an alkenyl group, an alkynyl group, an aryl group, or a heteroaryl group, all of which may have a substituent, here, $R^1$ and $R^{12}$ are the same group, $R^5$ and $R^8$ are the same group, and $R^6$ and $R^7$ are the same group, and any one combination of $R^5$ and $R^8$, and $R^6$ and $R^7$ is a group other than a hydrogen atom.

16. The compound according to claim 11, wherein the compound is represented by General Formula (5) or General Formula (6) and has a molecular weight of 3,000 or less,

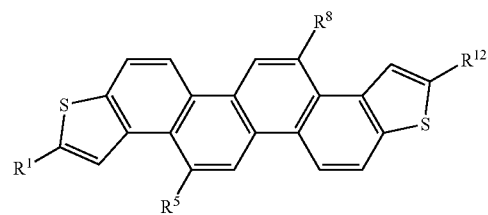

General Formula (5)

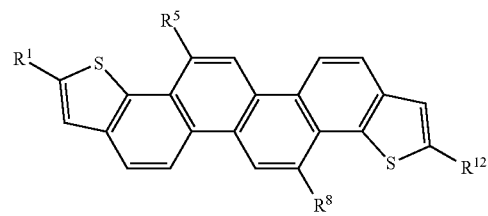

General Formula (6)

in General Formulae (5) and (6), $R^1$, $R^5$, $R^8$, and $R^{12}$ each independently represent a group represented by Formula (W),

-L$^W$-R$^W$ (W)

in Formula (W), $L^W$ is a divalent linking group of any of a single bond, —O—, —S—, —NR$^{13}$—, —CO—, —SO—, —SO$_2$—, or —Si(R$^{14}$)(R$^{15}$) or a divalent linking group obtained by bonding two or more divalent linking groups described above, $R^W$ represents a hydrogen atom, a substituted or unsubstituted alkyl group having 20 or less carbon atoms, a substituted or unsubstituted alkenyl group having 20 or less carbon atoms, a substituted or unsubstituted alkynyl group having 20 or less carbon atoms, a substituted or unsubstituted aryl group having 20 or less carbon atoms, or a substituted or unsubstituted heteroaryl group having 20 or less carbon atoms, $R^{13}$ to $R^{15}$ each independently represent a hydrogen atom or an alkyl group, an alkenyl group, an alkynyl group, an aryl group, or a heteroaryl group, all of which may have a substituent, here, $R^1$ and $R^{12}$ are the same group, $R^5$ and $R^8$ are the same group, and the combination of $R^5$ and $R^8$ is a group other than a hydrogen atom.

17. A material for an organic thin-film transistor comprising:
the compound according to claim 11.

18. A composition for an organic thin-film transistor comprising:
the compound according to claim 11.

19. A method for manufacturing an organic thin-film transistor comprising:
a step of forming an organic semiconductor film by applying the composition for an organic thin-film transistor according to claim 18 on a substrate and drying the composition.

20. An organic semiconductor film comprising:
the compound according to claim 11.

* * * * *